United States Patent
Kim et al.

(10) Patent No.: US 12,402,474 B2
(45) Date of Patent: Aug. 26, 2025

(54) DISPLAY DEVICE AND METHOD FOR MANUFACTURING THE SAME

(71) Applicant: Samsung Display Co., Ltd., Yongin-si (KR)

(72) Inventors: Young Do Kim, Cheonan-si (KR); Muhyun Kim, Seoul (KR); Hansun Ryou, Seoul (KR); Doyoung Jung, Asan-si (KR); Seohyeon Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 21 days.

(21) Appl. No.: 17/896,653

(22) Filed: Aug. 26, 2022

(65) Prior Publication Data
US 2023/0096530 A1    Mar. 30, 2023

(30) Foreign Application Priority Data
Aug. 30, 2021  (KR) .......................... 10-2021-0114716

(51) Int. Cl.
*H10K 50/858*   (2023.01)
*B32B 7/023*    (2019.01)
(Continued)

(52) U.S. Cl.
CPC ........... *H10K 50/858* (2023.02); *B32B 7/023* (2019.01); *B32B 7/12* (2013.01); *B32B 27/08* (2013.01);
(Continued)

(58) Field of Classification Search
CPC ........ H10K 10/80–10/88; H10K 59/80–59/95; H10K 77/00–77/111; G06F 1/00–1/3296; C09J 133/00–133/26
See application file for complete search history.

(56) References Cited

U.S. PATENT DOCUMENTS 9,774,005 B2 *   9/2017   Abe ..................... G02B 5/0242
9,862,124 B2 *   1/2018   Radcliffe ................... C09J 7/20
(Continued)

FOREIGN PATENT DOCUMENTS

EP         1211298 A2 *  6/2002  ............ C08F 220/30
KR    10-2002-0044070        6/2002
(Continued)

OTHER PUBLICATIONS

Dobrowolski, J.A. (eds. Bass et al.). "Chapter 42: Optical Properties of Films and Coatings", Handbook of Optics, vol. I: Fundamentals, Techniques, and Design, (1995); pp. 42.3 to 42.130.*

*Primary Examiner* — Prashant J Khatri
(74) *Attorney, Agent, or Firm* — KILE PARK REED & HOUTTEMAN PLLC

(57) ABSTRACT

A display device includes a display panel including a light emitting region and a peripheral region adjacent to the light emitting region; an organic layer disposed on the display panel and having an opening that overlaps the light emitting region; and an adhesive layer disposed on the organic layer. The adhesive layer includes a first adhesive layer including a first base resin and having a first refractive index; and a second adhesive layer disposed on the first adhesive layer and having a second refractive index less than the first refractive index.

16 Claims, 15 Drawing Sheets

(51) Int. Cl.
*B32B 7/12* (2006.01)
*B32B 27/08* (2006.01)
*B32B 27/20* (2006.01)
*B32B 27/30* (2006.01)
*B32B 37/12* (2006.01)
*C09J 133/10* (2006.01)
*C09J 133/14* (2006.01)
*H10K 50/86* (2023.01)
*H10K 59/122* (2023.01)
*H10K 102/00* (2023.01)

(52) U.S. Cl.
CPC ............ *B32B 27/20* (2013.01); *B32B 27/308* (2013.01); *B32B 37/12* (2013.01); *C09J 133/10* (2013.01); *C09J 133/14* (2013.01); *B32B 2264/1022* (2020.08); *B32B 2264/1024* (2020.08); *B32B 2307/416* (2013.01); *B32B 2307/418* (2013.01); *B32B 2307/54* (2013.01); *B32B 2307/732* (2013.01); *B32B 2457/206* (2013.01); *H10K 50/865* (2023.02); *H10K 59/122* (2023.02); *H10K 2102/311* (2023.02)

(56) References Cited

U.S. PATENT DOCUMENTS

| | | | |
|---|---|---|---|
| 10,199,608 | B2 | 2/2019 | Woo et al. |
| 10,304,870 | B2 | 5/2019 | Kim et al. |
| 10,529,947 | B2 | 1/2020 | Baek |
| 2002/0098352 | A1 | 7/2002 | Kishioka |
| 2018/0123083 | A1* | 5/2018 | Im ............................ H10K 71/00 |
| 2018/0138442 | A1* | 5/2018 | Kim ........................ H10K 59/87 |
| 2019/0115547 | A1* | 4/2019 | Lee ........................ B32B 27/365 |

FOREIGN PATENT DOCUMENTS

| | | |
|---|---|---|
| KR | 10-2011-0134174 | 12/2011 |
| KR | 10-2016-0023670 | 3/2016 |
| KR | 10-2017-0029670 | 3/2017 |
| KR | 10-2018-0046424 | 5/2018 |
| KR | 10-2018-0053483 | 5/2018 |
| KR | 10-2018-0125674 | 11/2018 |
| KR | 10-1971832 | 4/2019 |
| WO | WO-2017123491 A1 * 7/2017 ............ B29D 11/00 |

* cited by examiner

DISPLAY DEVICE AND METHOD FOR MANUFACTURING THE SAME

CROSS-REFERENCE TO RELATED APPLICATION(S)

This U.S. non-provisional patent application claims priority to and the benefit of Korean Patent Application No. 10-2021-0114716 under 35 U.S.C. § 119, filed on Aug. 30, 2021, the entire contents of which are hereby incorporated by reference.

BACKGROUND

1. Technical Field

The disclosure herein relates to a display device and a method for manufacturing the same, and more particularly, to a display device having improved optical properties as well as ensuring durability and flexibility, and a method for manufacturing the same.

2. Description of the Related Art

Various electronic devices such as televisions, mobile phones, tablet computers, navigation systems, and game consoles may be provided with display devices for displaying images. Display devices may include light emitting elements emitting light, such as organic light emitting elements. Light generated from light emitting elements may be emitted not only in a front direction but also in a side direction of electronic devices. Display devices may have different light output efficiencies depending on a direction in which light is emitted, and thus, there is a demand for developing technology to increase the light output efficiency of display devices.

SUMMARY

The disclosure provides a display device having excellent optical properties as well as having low modulus properties by securing fluidity absorbing external shocks, and a method for manufacturing the same.

An embodiment provides that a display device may include a display panel including a light emitting region and a peripheral region adjacent to the light emitting region; an organic layer disposed on the display panel and having an opening that may overlap the light emitting region; and an adhesive layer disposed on the organic layer. The adhesive layer may include a first adhesive layer including a first base resin and having a first refractive index; and a second adhesive layer disposed on the first adhesive layer, the second adhesive layer including a second base resin and having a second refractive index lower than the first refractive index.

In an embodiment, the first base resin may include an aromatic (meth)acrylate compound.

In an embodiment, the aromatic (meth)acrylate compound may be represented by any one of Formula 1, Formula 2, and Formula 3.

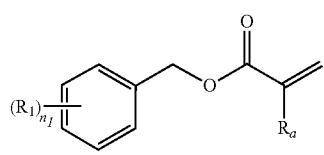

[Formula 1]

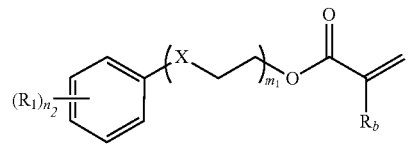

[Formula 2]

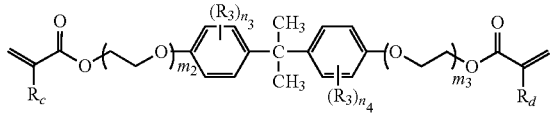

[Formula 3]

In Formulas 1 to 3, X may be O or S, $R_a$, $R_b$, $R_c$, and $R_d$ may be a hydrogen atom, or a substituted or unsubstituted methyl group, $R_1$, $R_2$, $R_3$, and $R_4$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $n_1$ and $n_2$ may be each independently an integer from 0 to 5, $n_3$ and $n_4$ may be each independently an integer from 0 to 4, and $m_1$, $m_2$, and $m_3$ may be each independently an integer from 0 to 6.

In an embodiment, the second base resin may include an aliphatic (meth)acrylate compound.

In an embodiment, the first adhesive layer may further include a filler dispersed in the first base resin.

In an embodiment, the filler may include at least one of zirconium oxide and titanium oxide.

In an embodiment, the filler may include polystyrene beads.

In an embodiment, the first refractive index may be in a range of about 1.55 to about 1.70, and the second refractive index may be in a range of about 1.45 to about 1.48.

In an embodiment, the first adhesive layer may have a thickness in a range of about 3 μm to about 25 μm.

In an embodiment, the second adhesive layer may have a thickness in a range of about 25 μm to about 75 μm.

In an embodiment, the first adhesive layer may have a storage modulus in a range of about 0.2 MPa to about 10 MPa at −20° C., and the second adhesive layer may have a storage modulus in a range of about 0.05 MPa to about 0.15 MPa at −20° C.

In an embodiment, the organic layer may have a third refractive index, and the first refractive index may be greater than the third refractive index.

In an embodiment, the first adhesive layer may cover the organic layer.

In an embodiment, the display panel may further include a first non-folding region, a folding region, and a second non-folding region which are arranged in a predetermined direction.

In an embodiment, the display device may further include an input sensing member disposed between the display panel and the adhesive layer.

In an embodiment, the display device may further include an anti-reflection member disposed on the adhesive layer.

In an embodiment, a display device may include a folding region and a non-folding region which are adjacent to each other, a display panel including a light emitting region and a peripheral region adjacent to the light emitting region; an organic layer disposed on the display panel and having an opening that may overlap the light emitting region; and an adhesive layer disposed on the organic layer. The adhesive layer may include a first adhesive layer including a first base resin, the first base resin including an aromatic (meth) acrylate compound; and a second adhesive layer disposed on the first adhesive layer and including a second base resin.

In an embodiment, the first adhesive layer may have a refractive index greater than a refractive index of the organic layer and a refractive index of the second adhesive layer.

In an embodiment, the first adhesive layer may further include a filler dispersed in the first base resin.

In an embodiment, a method for manufacturing a display device may include forming a first adhesive layer on a display panel; forming a second adhesive layer on the first adhesive layer, and forming an organic layer on the display panel. The display panel may include a light emitting region and a peripheral region, the organic layer may have an opening that overlaps the light emitting region, and the first adhesive layer and the second adhesive layer each may include a base resin.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1A:
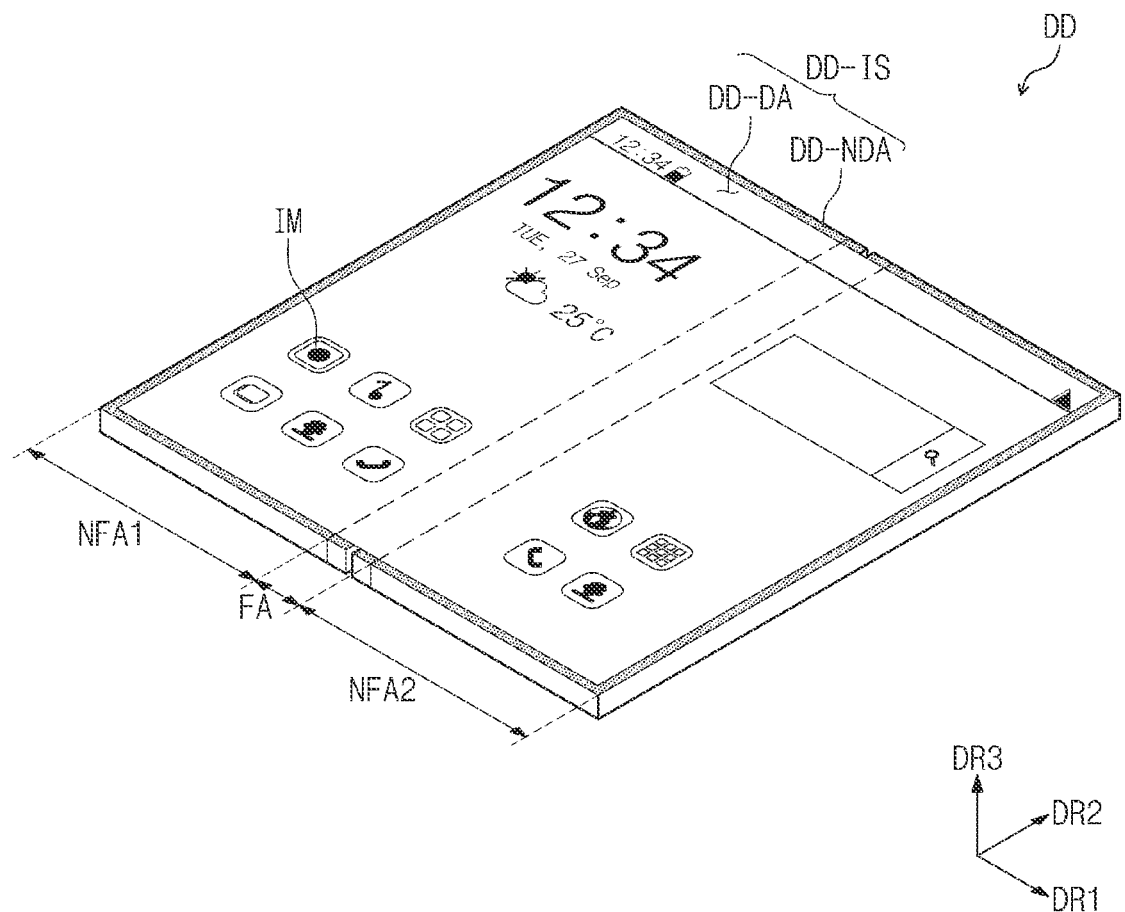
FIGS. 1A to 1C are perspective views of a display device according to an embodiment.

The disclosure may be modified in various and/or alternate forms. The embodiments will be described in detail referring to the drawings. It should be understood, however, that it is not intended to limit the disclosure to the particular forms disclosed, but rather, is intended to cover all modifications, equivalents, and alternatives falling within the spirit and scope of the disclosure.

In the description, when an element (or a region, a layer, a portion, etc.) is referred to as being "on," "connected to," or "coupled to" another element, it means that the element may be directly disposed on/connected to/coupled to the other element, or that a third element may be disposed therebetween.

In the description, "directly disposed" may indicate that there is no layer, film, region, plate or the like added between a portion of a layer, a film, a region, a plate or the like and other portions. For example, "directly disposed" may indicate disposing without additional members such as an adhesive member between two layers or two members. Like reference numerals refer to like elements.

In the drawings, the thickness, the ratio, and the dimensions of elements may be exaggerated for an effective description of technical contents.

The term "and/or," may include all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of embodiments of the disclosure. The terms of a singular form may include plural forms unless the context clearly indicates otherwise.

Terms such as "below," "lower," "above," "upper," and the like are used to describe the relationship of the configurations shown in the drawings. These terms have a relative concept, and are described on the basis of the directions indicated in the drawings. In the description, it should be understood that when an element is referred to as "disposed on", it may be also disposed "above" or "under" the other element.

Unless otherwise defined, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments will be described with reference to the accompanying drawings.

Figure 1B:
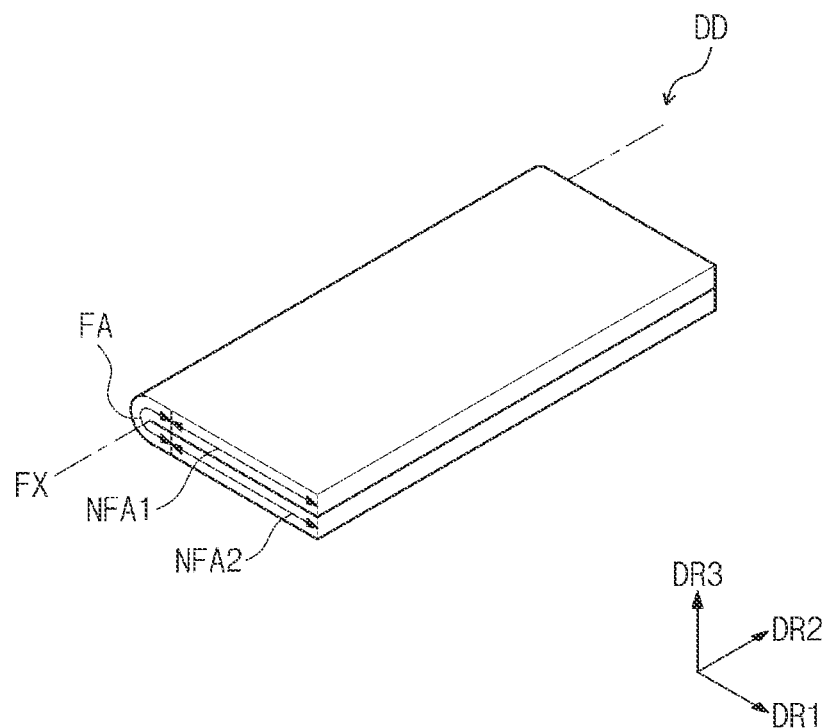
Figure 1C:
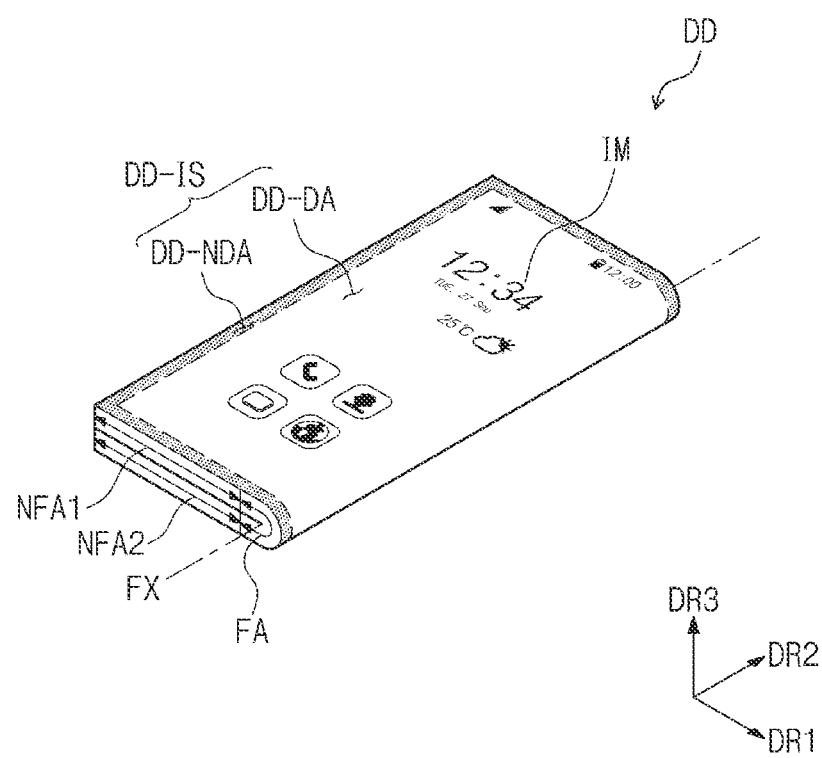

FIGS. 1A to 1C are perspective views of a display device DD according to an embodiment.

As illustrated in FIGS. 1A to 1C, a display surface DD-IS may be parallel to a plane defined by a first direction DR1 and a second direction DR2. A normal direction of the display surface DD-IS, for example, a thickness direction of the display device DD, may be indicated by a third direction DR3. A front surface (or an upper surface) and a rear surface (or a lower surface) of respective members may be defined with respect to the third direction DR3. Hereinafter, first to third directions may correspond to directions indicated by the first to third directions DR1, DR2, and DR3, respectively, and may be given the same reference numerals.

As illustrated in FIGS. 1A to 1C, the display surface DD-IS may include a display region DD-DA in which an image IM may be displayed, and a non-display region DD-NDA positioned adjacent to the display region DD-DA. The non-display region DD-NDA may be a region in which images are not displayed. In FIGS. 1A to 1C, icon images are illustrated as an embodiment of the image IM. For example, the display region DD-DA may have a quadrangular shape. The non-display region DD-NDA may surround the display region DD-DA. However, the embodiment is not limited thereto, and the shape of the display region DD-DA and the shape of the non-display region DD-NDA may be modified.

As illustrated in FIGS. 1A to 1C, in the display device DD, multiple regions may be defined according to operation modes. The display device DD may include a folding region FA that may be folded about a folding axis FX, and a first non-folding region NFA1 and a second non-folding region NFA2 which may be positioned adjacent to the folding region FA. The folding region FA may be a region forming a curvature.

In the embodiment, the display device DD with the folding axis FX parallel to the second direction DR2 is illustrated as an embodiment. However, the embodiment is not limited thereto, and the folding axis FX may be parallel to the first direction DR1.

As illustrated in FIG. 1B, the display device DD may be inner-folded or inner-bent such that the display surface DD-IS of the first non-folding region NFA1 faces the display surface DD-IS of the second non-folding region NFA2. As illustrated in FIG. 1C, the display device DD may be outer-folded or outer-bent such that the display surface DD-IS is exposed to the outside.

In an embodiment, the display device DD may include multiple folding regions FA. The folding region FA may be defined to correspond to a mode in which users operate the display device DD. For example, the folding region FA may be defined in a diagonal direction crossing the first direction DR1 and the second direction DR2 in a plan view. An area of the folding region FA is not fixed and may vary according to a radius of curvature. According to an embodiment, the display device DD may be configured to repeat only the operating modes illustrated in FIGS. 1A and 1B, or may be configured to repeat only the operating modes illustrated in FIGS. 1A and 1C.

Although the embodiment illustrates a display device DD applied to a mobile phone, the embodiment is not limited thereto. The display device DD according to an embodiment may not only be used for large-sized electronic devices such as a television set and a monitor but also used for small- and medium-sized electronic devices such as a car navigation system, a game console, and a smart watch.

The display device DD according to an embodiment is not limited to a foldable display device. In an embodiment, the display device DD may be a non-folding display device that is not foldable or a rollable display device.

Figure 2:
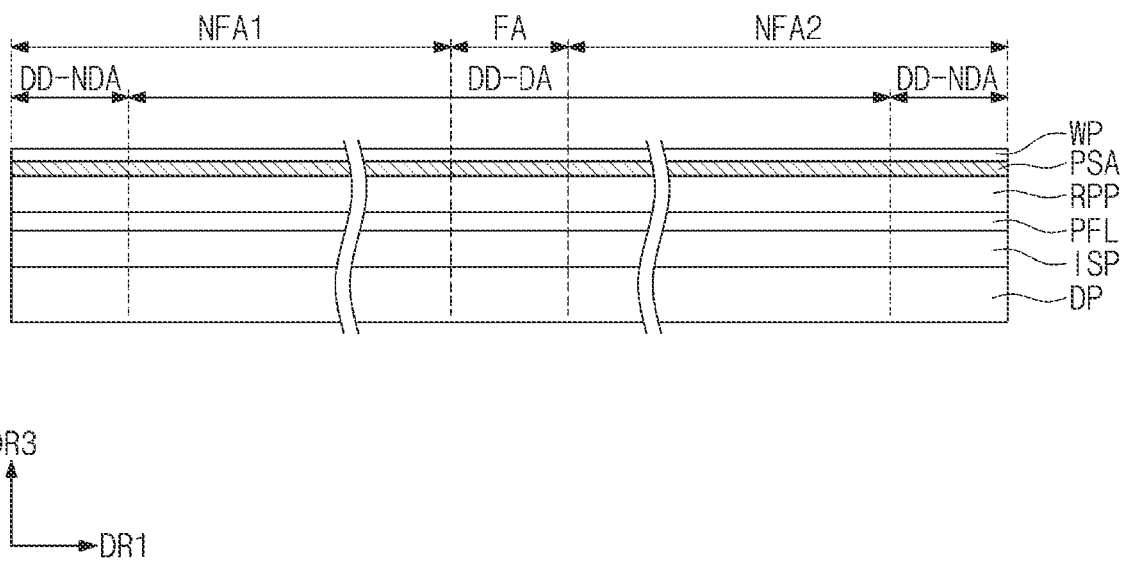
FIG. 2 is a schematic cross-sectional view of a display device according to an embodiment.

FIG. 2 is a schematic cross-sectional view of a display device DD according to an embodiment. FIG. 2 illustrates a cross-section of a display device DD defined by the first direction DR1 and the third direction DR3. In FIG. 2, the illustration of the display device DD is simplified to describe the stacking relationship of functional panels and/or functional units constituting a display device.

The display device DD according to an embodiment may include a display panel DP, an input sensing member ISP, an optical function layer PFL, an anti-reflection member RPP, and a window WP. In an embodiment, the input sensing member ISP may be omitted.

According to an embodiment, at least some of the components among the display panel DP, the input sensing member ISP, the optical function layer PFL, the anti-reflection member RPP, and the window WP may be formed through a continuous process, or at least some of the components may be bonded to each other by an adhesive layer. An adhesive layer may be omitted between the components formed through a continuous process. In the embodiment, the adhesive layer may be a pressure sensitive adhesive film (PSA). The adhesive layer described below may include typical adhesives or bonding agents, and is not particularly limited. An adhesive layer may be omitted between the components formed through a continuous process.

The display panel DP may generate images. The display panel DP may include multiple pixels. Each of the multiple pixels may include a display element and a driving circuit configured to control the operation of the display element. The driving circuit may include at least one transistor and a capacitor.

The display panel DP according to an embodiment may be a light emitting display panel including a light emitting element as a display element, and is not particularly limited. For example, the display panel DP may be an organic light emitting display panel or an inorganic light emitting display panel. An emission layer of the organic light emitting display panel may include an organic light emitting material. An emission layer of the inorganic light emitting display panel may include quantum dots, quantum rods, or inorganic LEDs. Hereinafter, the display panel DP will be described as an organic light emitting display panel.

The input sensing member ISP may be disposed on the display panel DP. The input sensing member ISP may acquire coordinate information of external inputs (e.g., a touch event). The input sensing member ISP may detect external inputs in a capacitive mode.

Figure 7:
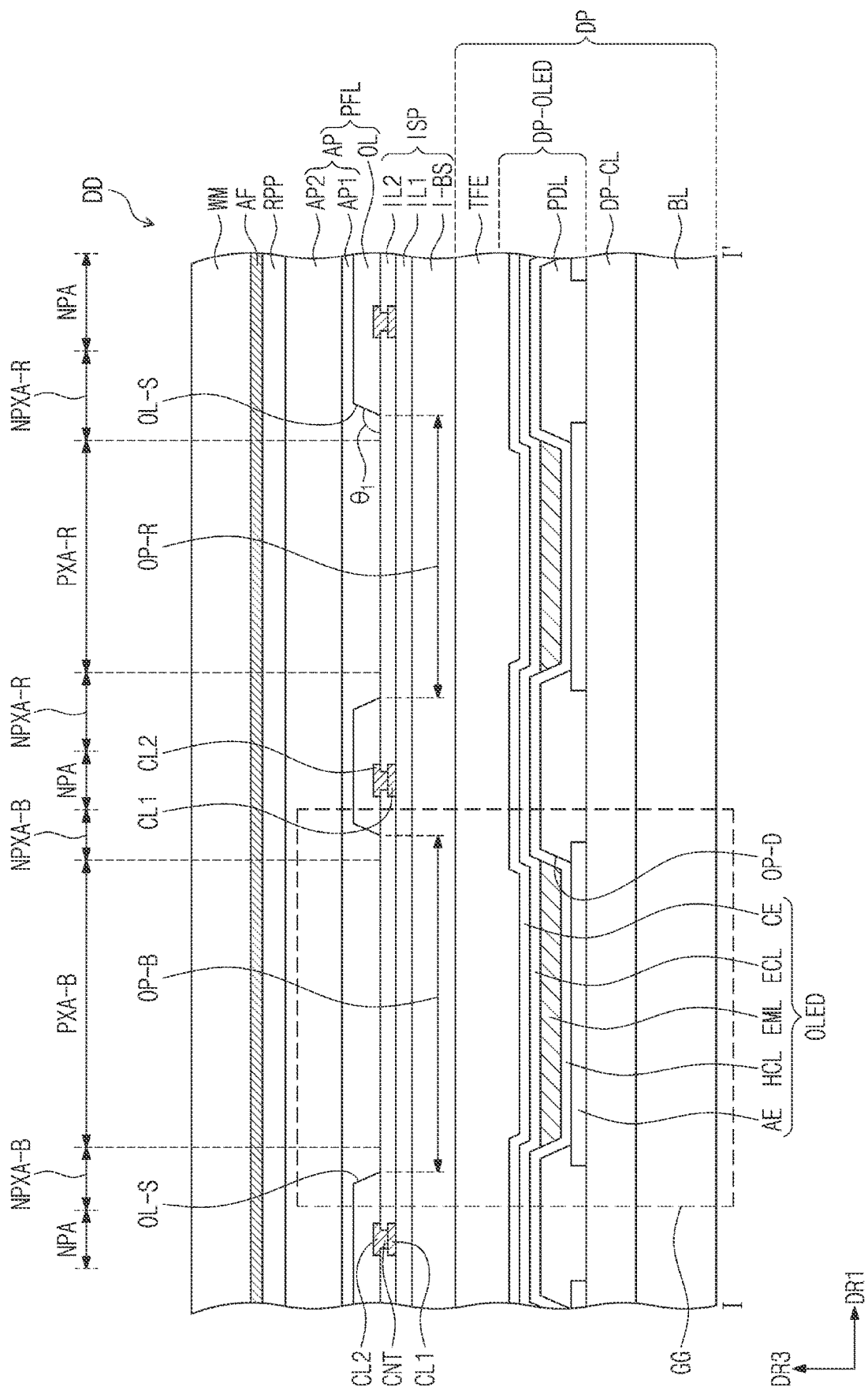
FIG. 7 is a schematic cross-sectional view of a display device taken along line I-I' shown in FIG. 5B according to an embodiment.

The optical function layer PFL may be disposed above the display panel DP. More specifically, the optical function layer PFL may be disposed on the input sensing member ISP. The optical function layer PFL may control a path of light (hereinafter, source light) generated from the display panel DP. The optical function layer PFL may collect light generated from a light emitting region of the display panel DP. The optical function layer PFL may include an organic layer OL (FIG. 7) disposed above the display panel DP, and an adhesive layer AP (FIG. 7) may be disposed on the organic layer OL (FIG. 7). The adhesive layer AP (FIG. 7) may have a stack structure of two layers, and each layer may include different base resins. Accordingly, the display device DD may be provided with both optical properties and bending reliability. Detailed descriptions of the optical function layer PFL will be described later.

The anti-reflection member RPP may reduce reflectance of natural light (or sunlight) incident from an upper side of the window WP. The anti-reflection member RPP according to an embodiment may include a light blocking pattern. The anti-reflection member RPP according to an embodiment may include color filters. The color filters may have a predetermined arrangement. The arrangement of the color filters may be determined according to the colors of pixels included in the display panel DP.

The window WP according to an embodiment may include a base layer (not shown) and a bezel layer (not shown). The base layer may have a multi-layered structure. The base layer may include a glass substrate or a synthetic resin film.

The bezel layer may partially overlap the base layer. The bezel layer may define a bezel region of the display device DD, for example, the non-display region DD-NDA (FIG. 1A). In an embodiment, the bezel layer may be disposed in other configurations.

Although not illustrated, a protection member may be disposed below the display panel DP. The protection member may support the display panel DP and may protect the display panel DP from external shocks.

Figure 3:
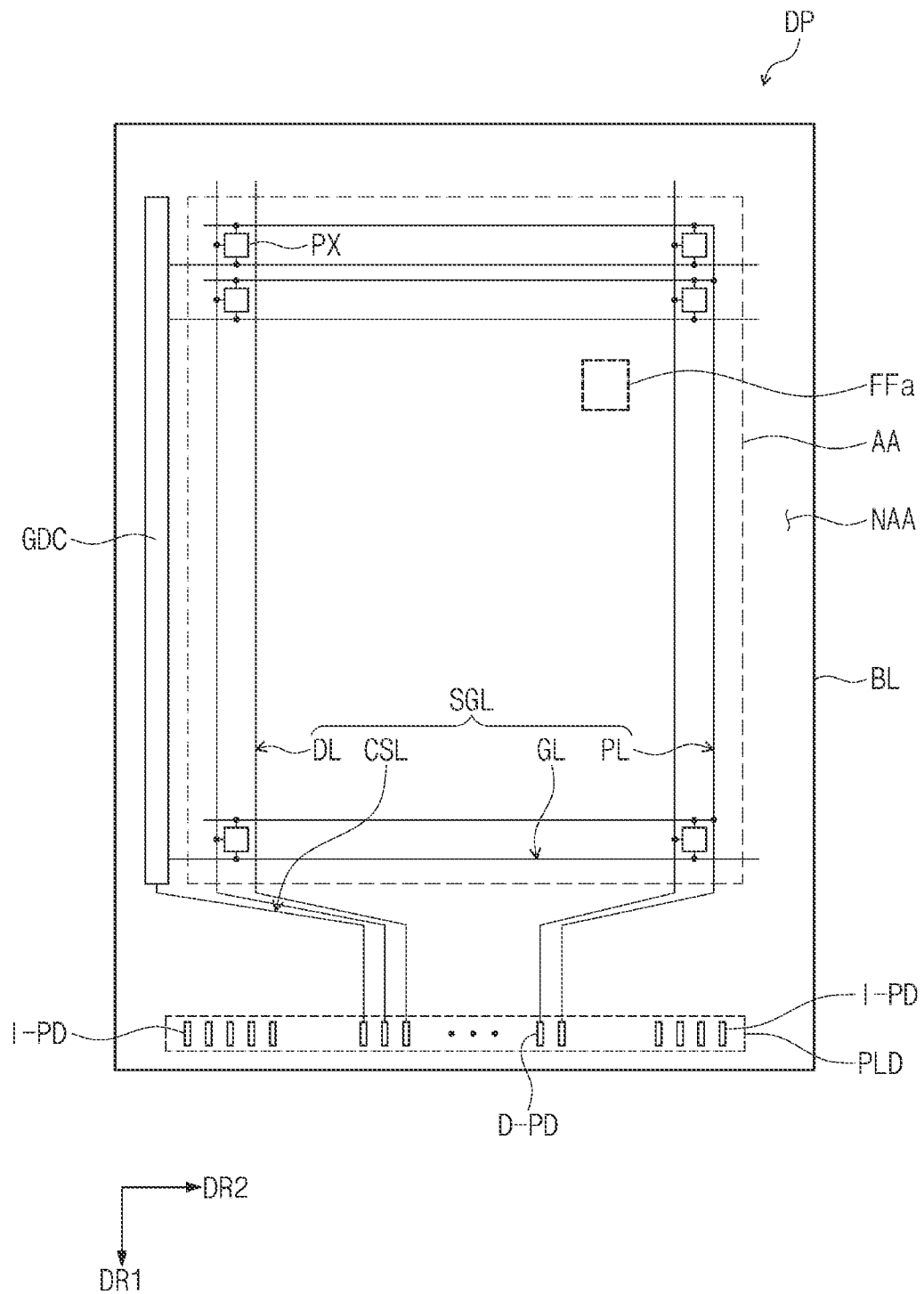
FIG. 3 is a plan view of a display panel according to an embodiment.

FIG. 3 is a plan view of a display panel according to an embodiment.

Referring to FIG. 3, the display panel DP may include a driving circuit GDC, multiple signal lines SGL, and multiple pixels PX. The display panel DP may include a pad portion PLD disposed in the peripheral region NAA. The pad portion PLD may include pixel pads D-PD electrically connected to a corresponding signal line among the multiple signal lines SGL.

The pixels PX may be disposed in an active region AA. Each of the pixels PX may include a light emitting element OLED (see FIG. 6) and a pixel driving circuit electrically connected thereto. The driving circuit GDC, the signal lines SGL, the pad portion PLD, and the pixel driving circuit may be included in a circuit element layer DP-CL shown in FIG. 6.

The driving circuit GDC may include a gate driving circuit. The gate driving circuit may generate multiple gate signals (hereinafter, gate signals) and may sequentially output the gate signals to multiple gate lines GL (hereinafter, gate lines) which will be described later. The gate driving circuit may further output another control signal to the pixel driving circuit.

The signal lines SGL may include gate lines GL, data lines DL, a power line PL, and a control signal line CSL. One gate line of the gate lines GL may be respectively electrically connected to a corresponding pixel PX among the pixels PX, and one data line of the data lines DL may be respectively electrically connected to a corresponding pixel PX among the pixels PX. The power line PL may be electrically connected to the pixels PX. The control signal line CSL may provide control signals to the driving circuit GDC. The signal lines SGL may overlap the active region AA and the peripheral region NAA.

The pad portion PLD may be a portion to which a flexible circuit film (not shown) is electrically connected, and may include the pixel pads D-PD for electrically connecting the flexible circuit film (not shown) to the display panel DP, and input pads I-PD for electrically connecting the flexible circuit film (not shown) to the input sensing member ISP. The pixel pads D-PD and the input pads I-PD may be provided where some of the lines disposed in the circuit element layer DP-CL are exposed from an insulating layer included in the circuit element layer DP-CL.

The pixel pads D-PD may be electrically connected to corresponding pixels PX through the signal lines SGL. The driving circuit GDC may be electrically connected to any one of the pixel pads D-PD.

Figure 4:
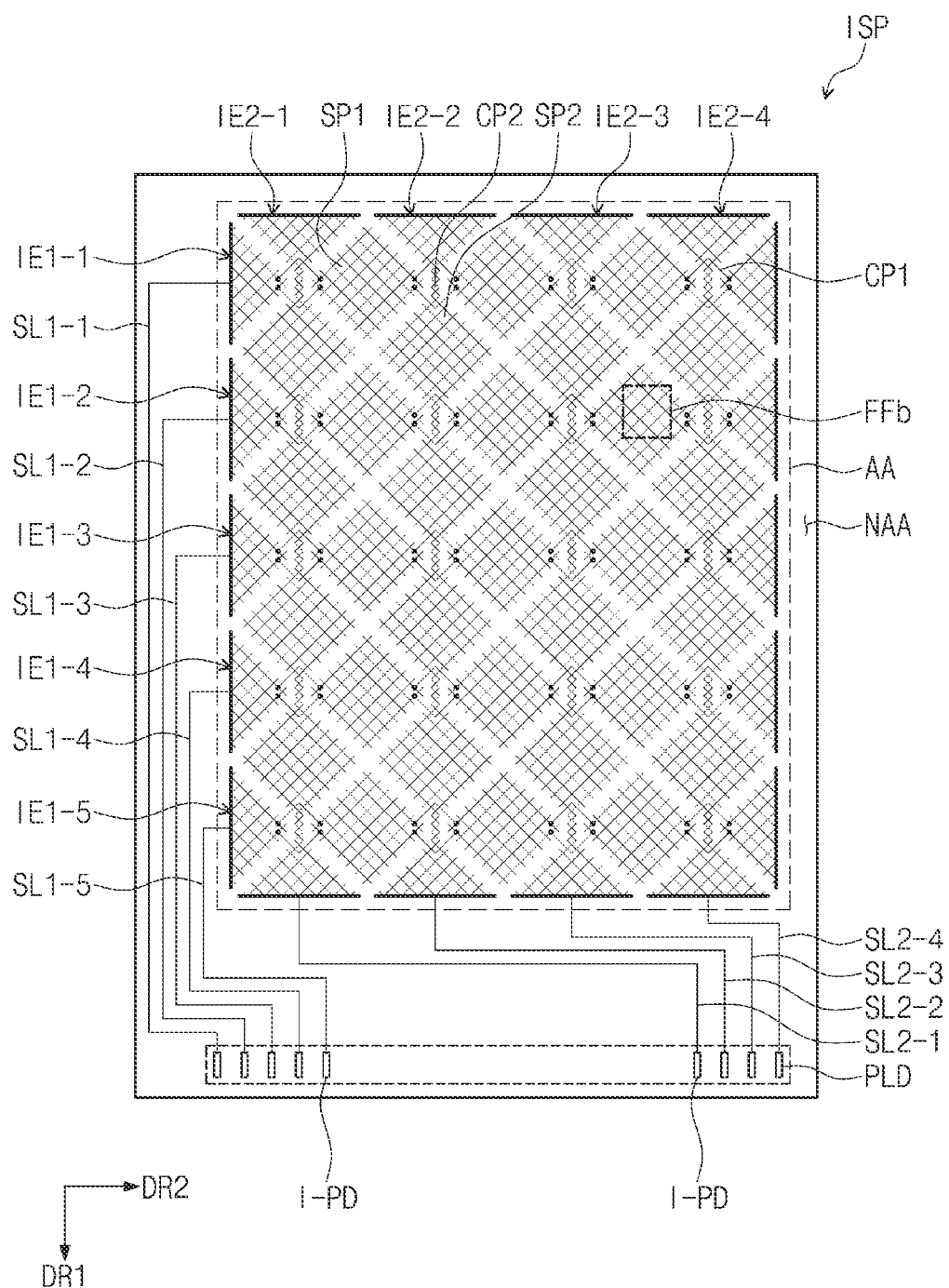
FIG. 4 is a plan view of an input sensing member according to an embodiment.

FIG. 4 is a plan view of an input sensing member according to an embodiment.

Referring to FIG. 4, the input sensing member ISP according to an embodiment may include first sensing electrodes IE1-1 to IE1-5, first signal lines SL1-1 to SL1-5 electrically connected to the first sensing electrodes IE1-1 to IE1-5, second sensing electrodes IE2-1 to IE2-4, and second signal lines SL2-1 to SL2-4 electrically connected to the second sensing electrodes IE2-1 to IE2-4. For example, the input sensing member ISP may include third signal lines electrically connected to the second sensing electrodes IE2-1 to IE2-4. In this case, the second signal lines SL2-1 to SL2-4 may be electrically connected to one end of the second sensing electrodes IE2-1 to IE2-4, and the third signal lines may be electrically connected to the other end of the second sensing electrodes IE2-1 to IE2-4.

The first sensing electrodes IE1-1 to IE1-5 and the second sensing electrodes IE2-1 to IE2-4 may cross each other. The first sensing electrodes IE1-1 to IE1-5 are arranged in the first direction DR1, and each may extend in the second direction DR2.

Each of the first sensing electrodes IE1-1 to IE1-5 may include first sensor portions SP1 and first connection portions CP1 disposed in the active region AA. Each of the second sensing electrodes IE2-1 to IE2-4 may include second sensor portions SP2 and second connection portions CP2 disposed in the active region AA. Two of the first sensor portions disposed on both ends of a first electrode among the first sensor portions SP1 may have a smaller size, for example, ½ size, compared to the first sensor portion SP1 disposed at the center. Two of the second sensor portions disposed at both ends of a second electrode among the second sensor portions SP2 may have a smaller size, for example, ½ size, compared to the second sensor portion disposed at the center.

FIG. 4 shows the first sensing electrodes IE1-1 to IE1-5 and the second sensing electrodes IE2-1 to IE2-4 according to an embodiment, but the shape thereof is not limited thereto. In an embodiment, the first sensing electrodes IE1-1 to IE1-5 and the second sensing electrodes IE2-1 to IE2-4 may have a shape without separation between the sensor portion and the connection portion (e.g., a bar shape). Although the first sensor portions SP1 and the second sensor portions SP2 having a rhombus shape are illustrated as an embodiment, the embodiment is not limited thereto, and the first sensor portions SP1 and the second sensor portions SP2 may have different polygonal shapes.

The first sensor portions SP1 in one first sensing electrode may be arranged along the second direction DR2, and the second sensor portions SP2 in one second sensing electrode may be arranged along the first direction DR1. Each of the first connection portions CP1 may connect adjacent first sensor portions SP1, and each of the second connection portions CP2 may connect adjacent second sensor portions SP2.

The first sensing electrodes IE1-1 to IE1-5 and the second sensing electrodes IE2-1 to IE2-4 may have a mesh shape. By having a mesh shape, the first sensing electrodes IE1-1 to IE1-5 and the second sensing electrodes IE2-1 to IE2-4 may have a reduced parasitic capacitance between the electrodes of the display panel DP (see FIG. 3). As described later, because the first sensing electrodes IE1-1 to IE1-5 and the second sensing electrodes IE2-1 to IE2-4 do not overlap light emitting regions PXA-R, PXA-G, and PXA-B (FIG. 5A), they may not be viewed by users of the display device DD.

The mesh-shaped first sensing electrodes IE1-1 to IE1-5 and second sensing electrodes IE2-1 to IE2-4 may include silver, aluminum, copper, chromium, nickel, titanium, and the like to which a low-temperature process is applicable, but is not limited thereto. As the sensing electrodes of the input sensing member ISP may be formed using silver, aluminum, copper, chrome, nickel, titanium, and the like to which a low-temperature process is applicable, even in case the input sensing member ISP is formed through a continuous process, the light emitting element OLED (FIG. 6) may be protected from damage.

The first signal lines SL1-1 to SL1-5 may be electrically connected to one end of the first sensing electrodes IE1-1 to IE1-5, respectively. In an embodiment, the input sensing member ISP may include signal lines electrically connected to the other ends of the first sensing electrodes IE1-1 to IE1-5.

The first signal lines SL1-1 to SL1-5 and the second signal lines SL2-1 to SL2-4 may be disposed in the peripheral region NAA. The input sensing member ISP may include the input pads I-PD extending from one end of the first signal lines SL1-1 to SL1-5 or the second signal lines SL2-1 to SL2-4, and disposed in the peripheral region NAA.

Figure 5A:
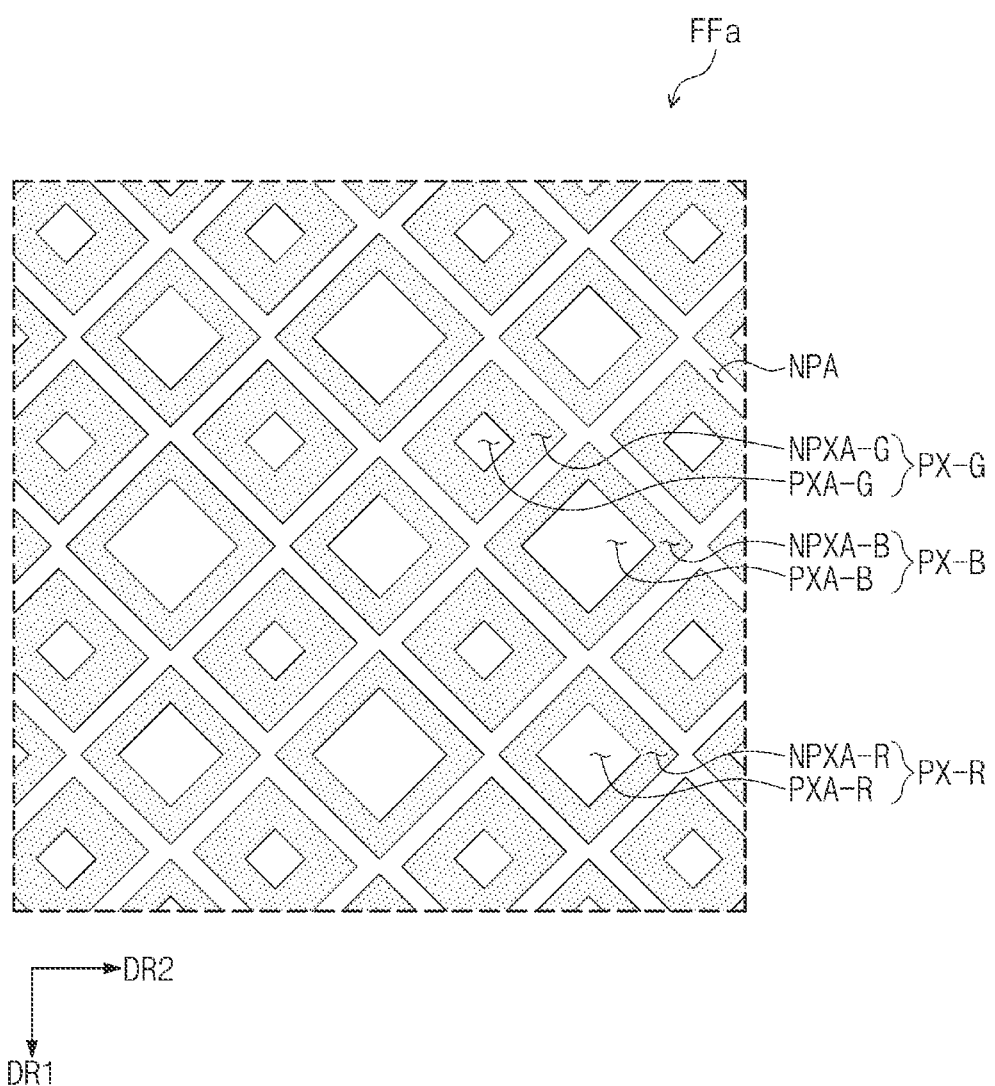
FIG. 5A is a plan view of an enlarged display panel corresponding to region FFa shown in FIG. 3.
Figure 5B:
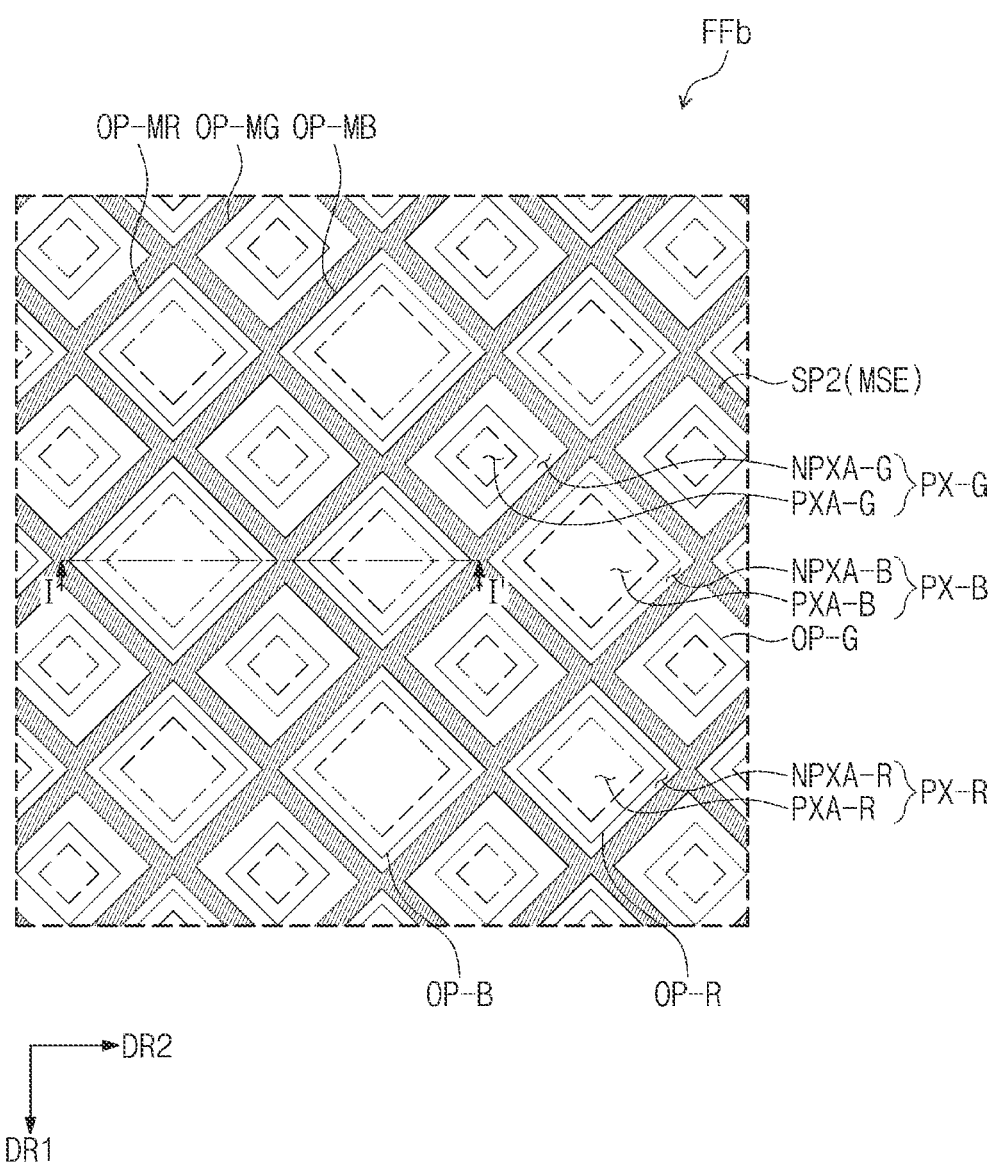
FIG. 5B is a plan view of an enlarged region FFb of the input sensing member shown in FIG. 4.

FIG. 5A is a plan view of an enlarged portion of a display panel according to an embodiment. FIG. 5B is a plan view of an enlarged portion of an input sensing member according to an embodiment. FIG. 5A is a plan view of an enlarged display panel corresponding to region FFa shown in FIG. 3, and FIG. 5B is a plan view enlarging region FFb of the input sensing member shown in FIG. 4.

Referring to FIG. 5A, the display panel DP may include multiple pixels. In an embodiment, the multiple pixels may include multiple first pixels PX-R, multiple second pixels PX-B, and multiple third pixels PX-G, and the multiple first pixels PX-R, the multiple second pixels PX-B, and the multiple third pixels PX-G may be different in size. For example, the third pixels PX-G may have a smaller size than the first pixels PX-R, and the first pixels PX-R may have a smaller size than the second pixels PX-B. In an embodiment, the first pixels PX-R may be pixels outputting red light, the second pixels PX-B may be pixels outputting blue light, and the third pixels PX-G may be pixels outputting green light.

The first pixels PX-R and the second pixels PX-B may be alternately placed and arranged along the first direction DR1 and the second direction DR2. The third pixels PX-G may be arranged along the first direction DR1 and the second direction DR2. A non-pixel region NPA may be provided between the first to third pixels PX-R, PX-B, and PX-G.

The arrangement structure of the first to third pixels PX-R, PX-B, and PX-G shown in FIG. 5A is illustrated as an embodiment, and the embodiment is not limited thereto. For example, according to another embodiment, the first pixel PX-R, the second pixel PX-B, and the third pixel PX-G may be alternately arranged along the second direction DR2. Each of the first to third pixels PX-R, PX-B, and PX-G may have a rectangular shape as an embodiment, but are not limited thereto, and each of the first to third pixels PX-R, PX-B, and PX-G may be variously modified into the forms of polygons, circles, ellipses, and the like. In another embodiment, the first to third pixels PX-R, PX-B, and PX-G may be different in shape from each other. For example, the third pixel PX-G may have a hexagonal or an octagonal shape, and the first and second pixels PX-R and PX-B may have a rectangular shape.

FIG. 5A illustrates that the third pixels PX-G are smaller than the first pixels PX-R and the second pixels PX-B, but the embodiment is not limited thereto. For example, in another embodiment, the first to third pixels PX-R, PX-B, and PX-G may be the same in size.

Each of the first pixels PX-R may include a first light emitting region PXA-R outputting light and a first non-light emitting region NPXA-R formed around the first light emitting region PXA-R. Each of the second pixels PX-B may include a second light emitting region PXA-B outputting light and a second non-light emitting region NPXA-B formed around the second light emitting region PXA-B. Each of the third pixels PX-G may include a third light emitting region PXA-G outputting light and a third non-light emitting region NPXA-G formed around the third light emitting region PXA-G. The first to third non-light emitting regions NPXA-R, NPXA-B, and NPXA-G may be defined as regions in which light is not output.

Referring to FIGS. 4, 5A, and 5B, the second sensor portions SP2 of the input sensing member ISP may have a mesh shape. Each of the second sensor portions SP2 may include a mesh electrode MSE patterned in a mesh shape. The second sensor portions SP2 may be disposed in the non-pixel region NPA to increase the aperture ratio of the first to third pixels PX-R, PX-B, and PX-G and to reduce parasitic capacitance. The mesh electrode MSE may partially overlap the first to third non-light emitting regions NPXA-R, NPXA-B, and NPXA-G.

Each of the first sensor portions SP1 and each of the second sensor portions SP2 may have a mesh shape. In the first sensor portions SP1 and the second sensor portions SP2 each, multiple sensor openings OP-MR, OP-MB, and OP-MG may be defined corresponding to the pixels PX-R, PX-B, and PX-G. Accordingly, in a plan view, the first sensor portions SP1 and the second sensor portions SP2 may not overlap the first pixel PX-R, the second pixel PX-B, and the third pixel PX-G. For example, first sensor openings OP-MR may be defined in regions corresponding to the first pixel PX-R, second sensor openings OP-MB may be defined in regions corresponding to the second pixel PX-B, and third sensor openings OP-MG may be defined in regions corresponding to the third pixel PX-G.

Figure 6:
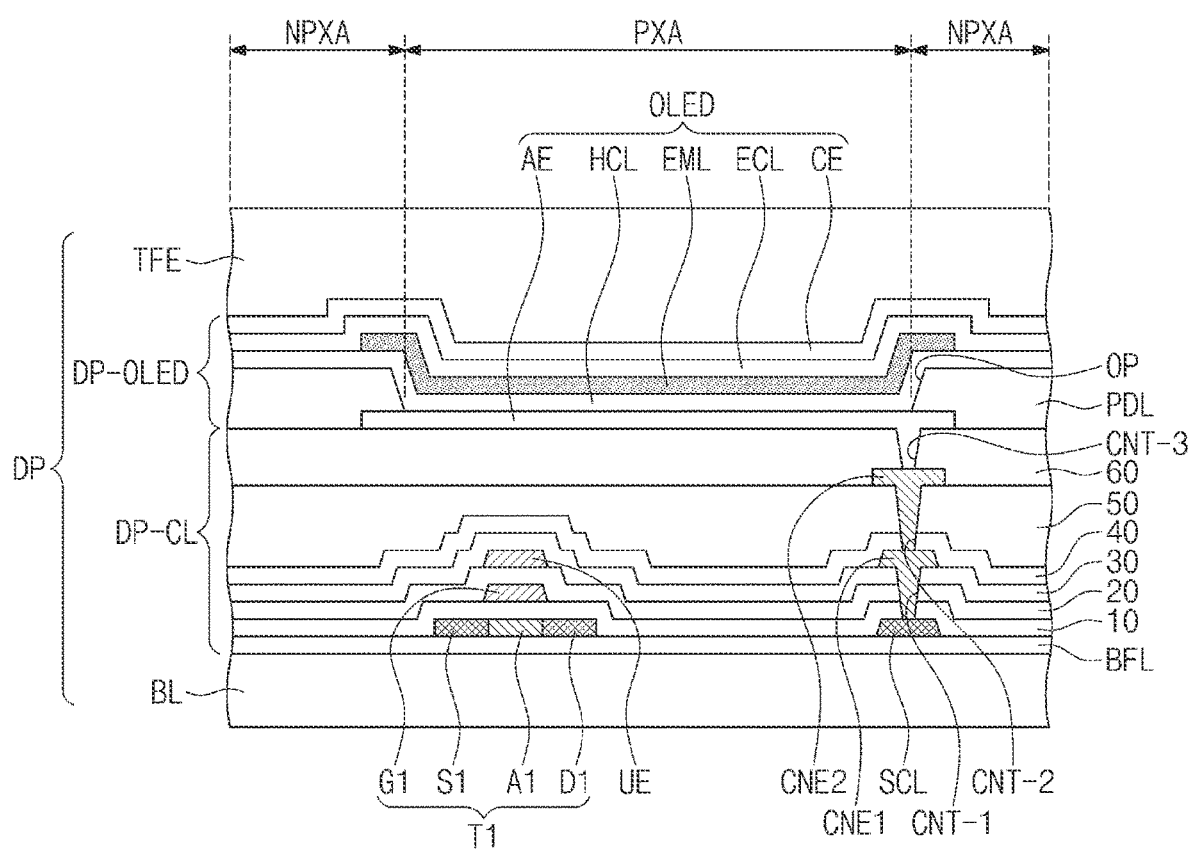
FIG. 6 is a schematic cross-sectional view of a display panel according to an embodiment.
Figure 8:
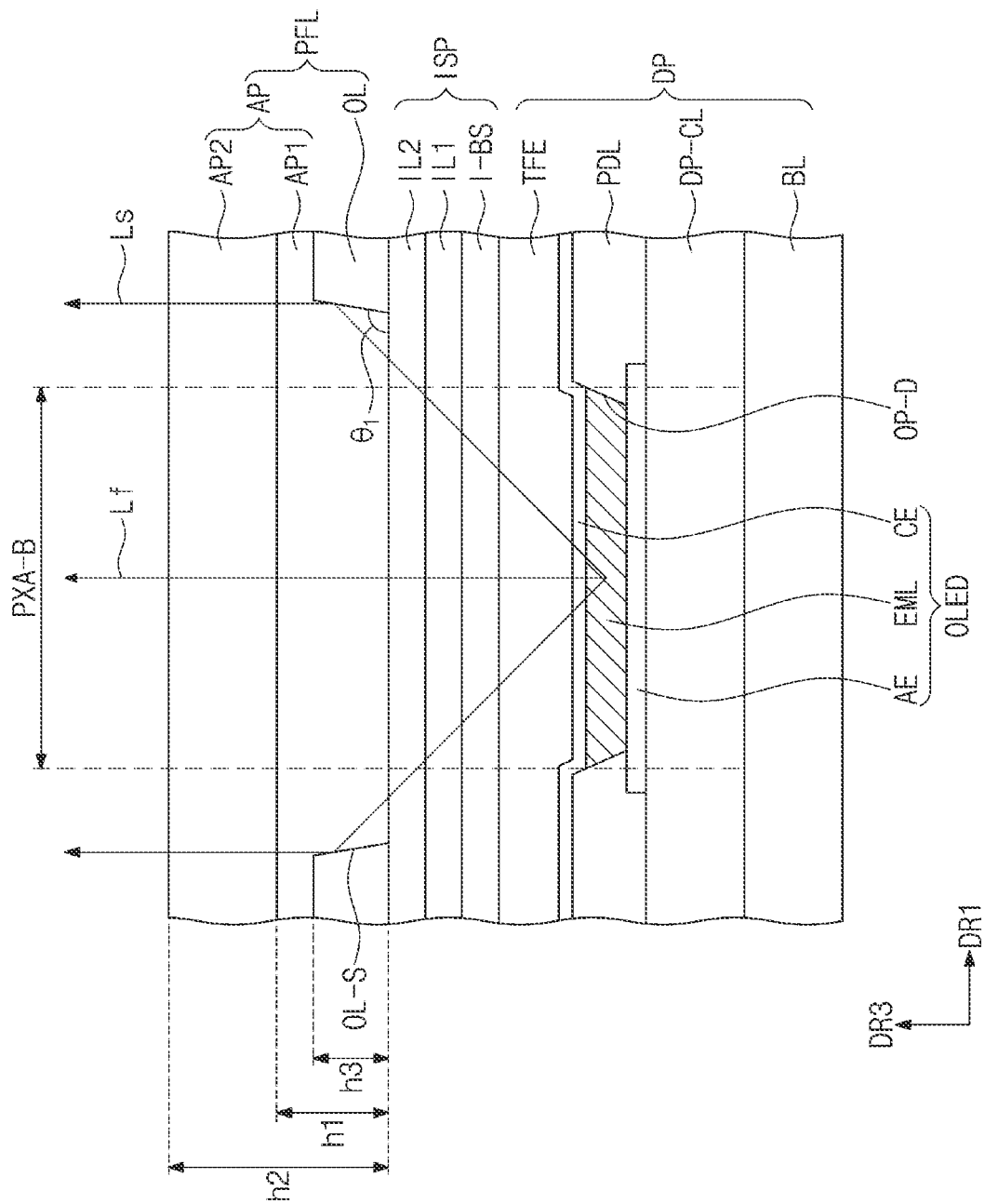
FIG. 8 is a schematic cross-sectional view of an enlarged portion GG shown in FIG. 7.

FIG. 6 is a schematic cross-sectional view of a display panel DP according to an embodiment. FIG. 7 is a schematic cross-sectional view of a display device taken along line I-I' shown in FIG. 5B according to an embodiment, and FIG. 8 is a schematic cross-sectional view of an enlarged portion GG shown in FIG. 7. However, a hole control layer HCL and an electron control layer ECL of the light emitting element OLED illustrated in FIG. 6 are omitted from FIG. 8 for convenience of description.

One light emitting region PXA illustrated in FIG. 6 may correspond to any one of the light emitting regions PXA-R, PXA-B, and PXA-G illustrated in FIG. 5A. The display panel DP may include a base layer BL, a circuit element layer DP-CL, a display element layer DP-OLED, and a thin film encapsulation layer TFE. The stacked structure of the display panel DP is not particularly limited.

Referring to FIG. 6, the display panel DP may include multiple insulating layers, semiconductor patterns, conductive patterns, signal lines, and the like. An insulating layer, a semiconductor layer, and a conductive layer may be formed through processes such as coating or deposition. Thereafter, the insulating layer, the semiconductor layer, and the conductive layer may be selectively patterned through photolithography and etching. Semiconductor patterns, conductive patterns, signal lines, and the like included in the circuit element layer DP-CL and the display element layer DP-OLED may be formed through such processes described above.

The base layer BL may include a synthetic resin film. The base layer BL may include a glass substrate, a metal substrate, or an organic/inorganic composite material substrate.

At least one inorganic layer may be disposed on an upper surface of the base layer BL. A buffer layer BFL may improve a bonding force between the base layer BL and the semiconductor patterns. The buffer layer BFL may include a silicon oxide layer and a silicon nitride layer. The silicon oxide layer and the silicon nitride layer may be alternately stacked.

The semiconductor patterns may be disposed on the buffer layer BFL. The semiconductor patterns may include polysilicon. However, the embodiment is not limited thereto, and the semiconductor patterns may include amorphous silicon or a metal oxide.

FIG. 6 illustrates only a portion of the semiconductor patterns, and the semiconductor patterns may be also disposed in the multiple light emitting regions PXA-R, PXA-B, and PXA-G (FIG. 5A) in a plan view. The semiconductor patterns may be arranged according to specific rules over the multiple light emitting regions PXA-R, PXA-B, and PXA-G (FIG. 5A). The semiconductor patterns may have different electrical properties according to with/without doping. The semiconductor patterns may include a first region having a high doping concentration and a second region having a low doping concentration. The first region may be doped with an N-type dopant or a P-type dopant. A P-type transistor may include the first region doped with the P-type dopant.

The first region may have greater conductivity than the second region, and may serve as an electrode or a signal line. The second region may be an active (or a channel) of a transistor. For example, a portion of the semiconductor patterns may be an active of the transistor, another portion may be a source or a drain of the transistor, and the other portion may be a conductive region.

As shown in FIG. 6, a source S1, an active A1, and a drain D1 of a transistor T1 may be formed by the semiconductor patterns. A portion of a signal transmission region SCL formed from the semiconductor patterns is illustrated in FIG. 6. Although not shown separately, the signal transmission region SCL may be electrically connected to the drain D1 of the transistor T1 in a plan view.

A first insulating layer 10 to a sixth insulating layer 60 may be disposed on the buffer layer BFL. The first insulating layer 10 to the sixth insulating layer 60 may be an inorganic layer or an organic layer. A gate G1 may be disposed on the first insulating layer 10. An upper electrode UE may be disposed on the second insulating layer 20. A first connection electrode CNE1 may be disposed on the third insulating layer 30. The first connection electrode CNE1 may be electrically connected to the signal transmission region SCL through a contact hole CNT-1 that may pass through the first to third insulating layers 10 to 30. A second connection electrode CNE2 may be disposed on the fifth insulating layer 50. The second connection electrode CNE2 may be electrically connected to the first connection electrode CNE1 through a contact hole CNT-2 that may pass through the fourth insulating layer 40 and the fifth insulating layer 50.

The light emitting element OLED may be disposed on the sixth insulating layer 60. A first electrode AE may be disposed on the sixth insulating layer 60. The first electrode AE may be electrically connected to the second connection electrode CNE2 through a contact hole CNT-3 that may pass through the sixth insulating layer 60. An opening OP may be defined in the pixel defining film PDL. The opening OP may expose at least a portion of the first electrode AE. The light emitting region PXA may be correspond to a portion of the first electrode AE exposed through the opening OP. The peripheral region NPXA may correspond to a region excluding the light emitting region PXA of the display region DD-DA (FIG. 1A).

The hole control layer HCL may be disposed in the light emitting region PXA and the peripheral region NPXA. The hole control layer HCL may include a hole transport layer, and may also include a hole injection layer. An emission layer EML may be disposed on the hole control layer HCL. The emission layer EML may be disposed in a region corresponding to the opening OP. For example, the emission layer EML may be separately formed in each of the light emitting regions PXA-R, PXA-B, and PXA-G (FIG. 5A).

An electron control layer ECL may be disposed on the emission layer EML. The electron control layer ECL may include an electron transport layer and may also include an electron injection layer. A second electrode CE may be disposed on the electron control layer ECL.

The thin film encapsulation layer TFE may be disposed on the second electrode CE. The thin film encapsulation layer TFE may seal the display element layer DP-OLED. The thin film encapsulation layer TFE may include at least one insulating layer. The thin film encapsulation layer TFE according to an embodiment may include at least one inorganic film (hereinafter, an encapsulation inorganic film). The thin film encapsulation layer TFE according to an embodiment may include at least one organic film (hereinafter, an encapsulation organic film) and at least one encapsulation inorganic film.

The encapsulation inorganic film may protect the display element layer DP-OLED from moisture/oxygen, and the encapsulation organic film may protect the display element layer DP-OLED from foreign substances such as dust particles. The encapsulation inorganic film may include a silicon nitride layer, a silicon oxy nitride layer, a silicon oxide layer, a titanium oxide layer, an aluminum oxide layer, and the like, but is not particularly limited thereto. The encapsulation organic film may include an acryl-based organic layer, but is not limited thereto.

Referring to FIG. 7, the input sensing member ISP may be disposed on the display panel DP. The input sensing member ISP may be directly disposed on the thin film encapsulation layer TFE of the display panel DP. The input sensing member ISP may include a base layer I-BS, first and second conductive layers disposed thereon, and first and second inorganic insulating layers IL1 and IL2. The base layer I-BS may be disposed on the thin film encapsulation layer TFE and may include an inorganic material. For example, the base layer I-BS may include a silicon nitride layer. An inorganic film disposed on an uppermost side of the thin film encapsulation layer TFE may also include silicon nitride, and the silicon nitride layer and the base layer I-BS of the thin film encapsulation layer TFE may be formed in different deposition conditions.

The first inorganic insulating layer IL1 may be disposed above the base layer I-BS. The first inorganic insulating layer IL1 may include the same material as the base layer I-BS. The first inorganic insulating layer IL1 may be thinner than the base layer I-BS. The first inorganic insulating layer IL1 may be omitted.

Referring to FIGS. 4, 5B, and 7, the first conductive layer CL1 may be disposed on the first inorganic insulating layer IL1. The first conductive layer CL1 may include a first sensor portion SP1, a second sensor portion SP2, and a second connection portion CP2. The second conductive layer CL2 may be is disposed on the first conductive layer CL1. The second conductive layer CL2 may include a first connection portion CP1. The second inorganic insulating layer IL2 may be disposed between the first conductive layer CL1 and the second conductive layer CL2. The second inorganic insulating layer IL2 may separate the first conductive layer CL1 and the second conductive layer CL2 apart on a cross section. A contact hole CNT for partially exposing the first conductive layer CL1 may be provided in the second inorganic insulating layer IL2, and the first conductive layer CL1 may be electrically connected to the second conductive layer CL2 through the contact hole CNT.

The second inorganic insulating layer IL2 may be disposed on the first inorganic insulating layer IL1.

The second inorganic insulating layer IL2 may include the same material as the first inorganic insulating layer IL1 and the base layer I-BS. The first and second inorganic insulating layers IL1 and IL2 may be thinner than the base layer I-BS.

As illustrated in FIG. 7, the optical function layer PFL may be disposed on the input sensing member ISP. The optical function layer PFL may be directly disposed on the input sensing member ISP. The optical function layer PFL may include the organic layer OL and the adhesive layer AP. The organic layer OL may be disposed on the input sensing member ISP, and the adhesive layer AP may be disposed on the organic layer OL to entirely cover the organic layer OL.

The organic layer OL may be disposed on the second insulating layer IL2. The organic layer OL may be an organic insulating layer disposed on the display panel DP with a predetermined pattern. The organic layer OL may include an organic insulating material. The organic insulating material may include at least any one of an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. However, this is presented as an embodiment, and the organic insulating material is not limited to the above embodiments.

Referring to FIGS. 5B and 7, multiple openings OP-R, OP-B, and OP-G may be defined in the organic layer OL. Each of the multiple openings OP-R, OP-B, and OP-G may be provided corresponding to the light emitting regions PXA-R, PXA-B, and PXA-G of each pixel PX-R, PX-B, and PX-G. In a plan view, each of the multiple openings OP-R, OP-B, and OP-G may overlap the light emitting regions PXA-R, PXA-B, and PXA-G of each pixel PX-R, PX-B, and PX-G. The multiple openings OP-R, OP-B, and OP-G may be different in size. In a plan view, each of the multiple openings OP-R, OP-B, and OP-G may be larger than the light emitting regions PXA-R, PXA-B, and PXA-G of each pixel PX-R, PX-B, and PX-G.

The multiple openings OP-R, OP-B, and OP-G may include a first opening OP-R provided to correspond to the first light emitting region PXA-R of the first pixel PX-R, a second opening OP-B provided to correspond to the second light emitting region PXA-B of the second pixel PX-B, and a third opening OP-G provided to correspond to the third light emitting region PXA-G of the third pixel PX-G. The first opening OP-R may have a shape and size corresponding to the first light emitting region PXA-R, the second opening OP-B may have a shape and size corresponding to the second light emitting region PXA-B, and the third opening OP-G may have a shape and size corresponding to the third light emitting region PXA-G. Accordingly, the first to third openings OP-R, OP-B, and OP-G according to an embodiment may be different in size.

The adhesive layer AP may be disposed on the organic layer OL. The adhesive layer AP may be disposed to overlap the light emitting regions PXA-R, PXA-B, and PXA-G and the peripheral regions NPXA-R, NPXA-B, and NPXA-G. The adhesive layer AP may include a first adhesive layer AP1 and a second adhesive layer AP2. The first adhesive layer AP1 may be disposed on the organic layer OL, and the second adhesive layer AP2 may be disposed on the first adhesive layer AP1.

The first adhesive layer AP1 may be provided to fill the multiple openings OP-R, OP-B, and OP-G. The first adhesive layer AP1 may be disposed to entirely fill the multiple openings OP-R, OP-B, and OP-G and cover the organic layer OL. Accordingly, the first adhesive layer AP1 may have a flat upper surface.

The first adhesive layer AP1 may have a refractive index (hereinafter, a first refractive index) of about 1.55 to about 1.70. The second adhesive layer AP2 may have a refractive index (hereinafter, a second refractive index) of about 1.45 to about 1.48. The organic layer OL may have a refractive index (hereinafter, a third refractive index) of about 1.45 to about 1.54. For example, the first refractive index may be greater than the second refractive index and the third refractive index.

Referring to FIG. 8, light output from light emitting element OLED may be emitted not only in a front direction, for example, in the third direction DR3, but also in a side direction. The light efficiency may be determined with respect to the light emitted in the front direction. According to an embodiment, front light Lf output from the light emitting element OLED in the front direction may be output through the adhesive layer AP. Side light Ls emitted from the light emitting device OLED in the side direction may be emitted in a direction inclined at a predetermined angle with respect to the front light Lf.

The side light Ls may be refracted or totally reflected due to a difference in refractive index between the organic layer OL and the first adhesive layer AP1. Accordingly, the light path of the side light Ls may shift to the front direction, for example, in the third direction DR3 or a direction adjacent to the third direction DR3. As such, the shift of the light path of the side light Ls in the front direction may result in increased light efficiency of the display device DD.

The organic layer OL may include an inclined surface OL-S defining the multiple openings OP-R, OP-B, and OP-G. An angle $\Theta_1$ between the inclined surface OL-S and an upper surface of the second inorganic insulating layer IL2 exposed from the multiple openings OP-R, OP-B, and OP-G may be an obtuse angle. For example, the angle $\Theta_1$ between the inclined surface OL-S and the upper surface of the second inorganic insulating layer IL2 may be greater than 90° and less than 135°.

The adhesive layer AP of an embodiment may include the first adhesive layer AP1 and the second adhesive layer AP2 that may be sequentially disposed. The first adhesive layer AP1 and the second adhesive layer AP2 may be prepared using base resins having different compositions. Specifically, the first adhesive layer AP1 may include a first base resin, the second adhesive layer AP2 may include a second base resin, and the first base resin and the second base resin may be different from each other.

In the description, the term "substituted or unsubstituted" may indicate that one is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. The above-mentioned substituents may be substituted or unsubstituted. For example, a biphenyl group may be interpreted as an aryl group or as a phenyl group substituted with a phenyl group.

In the description, examples of a halogen atom may include a fluorine atom, a chlorine atom, a bromine atom, or an iodine atom.

In the description, an alkyl group may be a linear, branched or cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the description, an aryl group may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

In the description, a heteroaryl group may include at least one of B, O, N, P, Si, or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the description, (meth)acrylate may refer to acrylate or methacrylate.

In the description, aromatic (meth)acrylate may be a (meth)acrylate monomer including at least one aromatic substituent. The type of the aromatic (meth)acrylate is not particularly limited, but may include (meth)acrylate containing an aryl group having 6 to 30, 6 to 20, or 6 to 10 ring-forming carbon atoms.

A monofunctional or polyfunctional aromatic (meth)acrylate monomer may be used as the aromatic (meth)acrylate.

Examples of the monofunctional aromatic (meth)acrylate monomer may include phenyl (meth)acrylate, benzyl (meth)acrylate, phenoxyethyl (meth)acrylate, phenoxypropyl (meth)acrylate, phenoxydiethylene glycol (meth)acrylate, and phenoxyhydroxypropyl (meth)acrylate, but are not limited thereto.

Examples of the polyfunctional aromatic (meth)acrylate monomer may include a bifunctional aromatic (meth)acrylate monomer, and the like. Specifically, examples of the polyfunctional aromatic (meth)acrylate monomer may include bisphenol A (meth)acrylate, bisphenol A ethoxy (meth)acrylate, 2,2-bis((meth)acryloxyphenyl)propane, 2,2-bis[4-(3-(meth)acryloxy)-2-hydroxypropoxyphenyl]propane, 2,2-bis(4-(meth)acryloxyethoxyphenyl)propane, 2,2-bis(4-(meth)acryloxydiethoxyphenyl)propane, 2,2-bis(4-(meth)acryloxytriethoxyphenyl)propane, 2,2-bis(4-(meth)acryloxytetraethoxyphenyl)propane, 2,2-bis(4-(meth))acryloxypentaethoxyphenyl)propane, 2,2-bis(4-(meth)acryloxypropoxyphenyl)propane, 2(4-(meth)acryloxydiethoxyphenyl)-2(4-(meth)acryloxydiethoxyphenyl)propane, 2(4-(meth)acryloxydiethoxyphenyl)-2(4-(meth)acryloxytriethoxyphenyl)propane, 2,2-bis(4-(meth)acryloxypropoxyphenyl)propane, 2,2-bis(4-(meth)acryloxyisopropoxyphenyl)propane, and 2(4-acryloxydipropoxyphenyl)-2(4-(meth)acryloxytrieoxyphenyl)propane, but are not limited thereto.

In the description, aliphatic (meth)acrylate may be a (meth)acrylate monomer including at least one aliphatic substituent. The type of the aliphatic (meth)acrylate is not particularly limited, but may include (meth)acrylate containing an alkyl group having 1 to 30, 1 to 20, or 1 to 10 carbon atoms.

A monofunctional or polyfunctional aliphatic (meth)acrylate may be used as the aliphatic (meth)acrylate.

Examples of the monofunctional aliphatic (meth)acrylate may include methyl (meth)acrylate, ethyl (meth)acrylate, propyl (meth)acrylate, n-butyl (meth)acrylate, iso-butyl (meth)acrylate, t-butyl (meth)acrylate, hexyl (meth)acrylate, 2-ethylhexyl (meth)acrylate, iso-octyl (meth)acrylate, iso-nonyl (meth)acrylate, iso-pentyl (meth)acrylate, tridecyl (meth)acrylate, stearyl (meth)acrylate, and lauryl (meth)acrylate, but are not limited thereto.

Examples of the polyfunctional aliphatic (meth)acrylate monomer may include: bifunctional aliphatic (meth)acrylate such as ethylene glycol di(meth)acrylate, diethylene glycol di(meth)acrylate, triethylene glycol di(meth)acrylate, butylene glycol di(meth)acrylate, neopentyl glycol di(meth)acrylate, propylene glycol di(meth)acrylate, 1,3-butanediol di(meth)acrylate, 1,4-butanediol di(meth)acrylate, and 1,6-hexanediol di(meth)acrylate; trifunctional aliphatic (meth)acrylate such as trimethylolpropane tri(meth)acrylate, trimethylolethane tri(meth)acrylate, trimethylolethanol tri(meth)acrylate, and trimethylolmethane tri(meth)acrylate; or tetrafunctional aliphatic (meth)acrylates such as pentaerythritol tetra(meth)acrylate, but are not limited thereto.

In an embodiment, the first base resin may include a polymer resin having a refractive index of about 1.5 to about 1.7. In case the refractive index of the first base resin satisfies the above range, the first adhesive layer AP1 having a higher refractive index than the organic layer OL may be obtained, and thus, the display device DD may have an increased light extraction efficiency. The first base resin included in the first adhesive layer AP1 may be used without limitation as long as the above refractive index is satisfied. For example, the first base resin may include an acrylic resin, a urethane-based resin, a fluorine-based resin, an epoxy-based resin, a polyester-based resin, a polyamide-based resin, a silicone-based resin, or a combination thereof. For example, the first base resin may include an acrylic resin.

Specifically, the first base resin may include aromatic (meth)acrylate. Accordingly, the first adhesive layer AP1 may include a polymer resin formed from an aromatic (meth)acrylate monomer or oligomer. The first base resin may include aromatic (meth)acrylate having an aromatic substituent with a large molar refractivity, and thus, the refractive index of the first adhesive layer AP1 may be easily adjusted in the range of 1.5 to 1.7. In case the first adhesive layer AP1 includes the first base resin having aromatic (meth)acrylate, the refractive index thereof may be relatively higher than that of an adhesive layer formed of a polymer resin made of aliphatic (meth)acrylate.

In an embodiment, the aromatic (meth)acrylate included in the first base resin may be represented by any one of Formulas 1 to 3 below.

filler may be a material having a refractive index of about 1.8 to about 3.0. In an embodiment, the filler may be an inorganic filler, an organic filler, an organic-inorganic composite filler, or a combination thereof.

The inorganic filler may include at least one metal oxide selected from the group consisting of titanium, zirconium, aluminum, indium, zinc, tin, and antimony. For example, the inorganic filler may include at least one of zirconium oxide ($ZrO_2$) or titanium oxide ($TiO_2$).

The organic filler may include a polymer material. For example, the organic filler may be polystyrene beads, polyethylene beads, polypropylene beads, polyvinylidenefluoride beads, polytetrafluoroethylene beads, polyurethane beads, polyethyleneterephthalate beads, polycarbonate beads, polyester beads, polyacrylonitrile beads, polymethylmethacrylate beads, polyamide beads, polyarylate beads, cellulose beads, melamine beads, phenolic resins, and the like. The organic filler may be polystyrene beads.

In case the first adhesive layer AP1 includes a filler, the refractive index of the first adhesive layer AP1 may be controlled in the range of about 1.55 to about 1.70. For example, as the first adhesive layer AP1 includes a filler dispersed in the first base resin, even in case the first base resin having a relatively low refractive index is used, the refractive index of the first adhesive layer AP1 may be controlled in the range of about 1.55 to about 1.70.

The filler may be implemented in various shapes. For example, the filler may have a spherical shape, a plate shape, a cubic shape, or an amorphous shape, but is not limited thereto. The filler may have an average particle diameter of about 25 nm or less. For example, the filler may have an average particle diameter of about 1 nm to about 25 nm. The

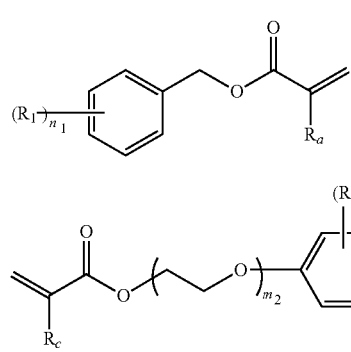

[Formula 1]

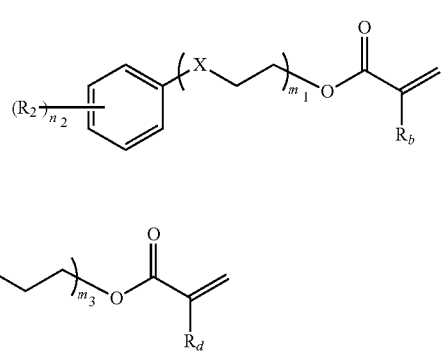

[Formula 2]

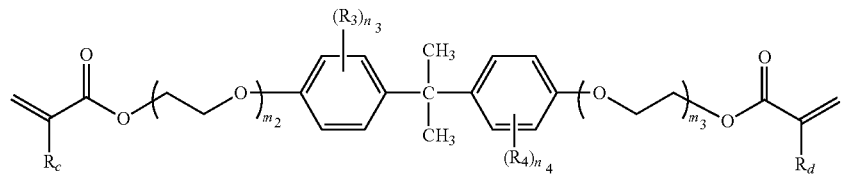

[Formula 3]

In Formulas 1 to 3, X is O or S.

In Formulas 1 to 3, $R_a$ to $R_d$ may be a hydrogen atom, or a substituted or unsubstituted methyl group.

In Formulas 1 to 3, $R_1$ to $R_4$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_1$ to $R_4$ may be a hydrogen atom.

In Formulas 1 to 3, $n_1$ and $n_2$ may be an integer of 0 to 5, $n_3$ and $n_4$ may be an integer of 0 to 4, and $m_1$ to $m_3$ may be an integer of 0 to 6.

In an embodiment, the first adhesive layer AP1 may include a filler. The first adhesive layer AP1 may include a filler dispersed in the first base resin. The filler may be a material having a high refractive index, and for example, the average particle diameter of the filler may be a particle size as given by the 50% cumulative volume, $D_{50}$ in a cumulative size-distribution curve.

In case the average particle diameter of the filler is less than 1 nm, the first adhesive layer AP1 may be hard to have high refractive properties, and in case the average particle diameter of the filler is greater than 25 nm, the filler may have reduced dispersion properties in the first base resin, and it may be hard to have uniform thin film characteristics. The filler may be used in a mixture of two or more different types or different sizes.

In case the first adhesive layer AP1 also includes a filler, the filler may take about 30 wt % or less of a total weight of the first base resin forming the first adhesive layer AP1. For example, the filler may take about 0.1 wt % to about 30 wt % of a total weight of the first base resin forming the first adhesive layer AP1.

In case the filler is included in an amount less than about 0.1 wt %, the display device DD of the first adhesive layer AP1 including the filler may have reduced light output efficiency. In case the filler is included in an amount greater than about 30 wt %, the first adhesive layer AP1 may have an increased modulus, and in case used as an adhesive layer of the display device DD for a foldable display device, a bending display device, and the like, folding and bending reliability may not be secured. In case the amount of the filler dispersed in the first base resin is appropriately selected within the above range, the refractive index and mechanical properties of the first adhesive layer may be controlled.

The first adhesive layer AP1 may be an adhesive layer having a storage modulus of about 0.2 MPa to about 10 MPa at −20° C. The first adhesive layer AP1 may have a storage modulus of about 0.02 MPa to about 0.1 MPa at room temperature (25° C.), and a storage modulus of about 0.01 MPa to about 0.05 MPa at 60° C. For example, the first adhesive layer AP1 may have a storage modulus of about 0.2 MPa to about 1.0 MPa at −20° C., a storage modulus of about 0.03 MPa to about 0.08 MPa at room temperature (25° C.), and a storage modulus of about 0.02 MPa to about 0.04 MPa at 60° C.

In an embodiment, in case the first adhesive layer AP1 has a storage modulus of less than about 0.2 MPa at −20° C., the first adhesive layer AP1 may not exhibit sufficient adhesive strength. In case the first adhesive layer AP1 has a storage modulus of greater than 10 MPa at −20° C., the bending or folding stress of the display device DD may not be absorbed, and thus the adhesive layer may crack.

In case the storage modulus of the first adhesive layer AP1 satisfies the above range at each temperature, there is an advantage in that the first adhesive layer AP1 is highly flexible, and the display device DD has a maximized durability such as folding or bending. As there is no significant difference in the range of the storage modulus of the first adhesive layer AP1 at room temperature (25° C.) or higher, products may be less deformed, and accordingly, the display device DD may have excellent mechanical reliability. In case the storage modulus of the first adhesive layer AP1 is out of the above range at each temperature, the temperature-dependent deformation of the first adhesive layer AP1 may increase, and thus the display device DD may have reduced durability and reliability.

The first adhesive layer AP1 may have a glass transition temperature Tg of about −10° C. or less. For example, the first adhesive layer AP1 may have a glass transition temperature of about −20° C. or less. In case the glass transition temperature of the first adhesive layer AP1 satisfies the above range, excellent flexibility and processability may be achieved, and durability of the display device DD may be enhanced.

The first adhesive layer AP1 may have a creep value of about 50% to about 100% at 60° C. In case the creep value of the first adhesive layer AP1 at 60° C. satisfies the above range, deformation of the first adhesive layer AP1 due to stress or pressure may be reduced. In case the creep value of the first adhesive layer AP1 at 60° C. is less than about 50%, deformation may not be sufficient in a folding mode, and in case the creep value of the first adhesive layer AP1 at 60° C. is 100%, restoring force may become insufficient. The creep value in the description is a creep value at 60° C., and may refer to a strain when a shear stress of about 2000 Pa is applied at 60° C. for 10 minutes.

The second adhesive layer AP2 may be disposed on the first adhesive layer AP1. The second adhesive layer AP2 may be directly disposed on the first adhesive layer AP1. The second adhesive layer AP2 may serve to enhance overall mechanical properties of the adhesive layer AP. The first adhesive layer AP1 may exhibit high refractive properties through the first base resin including aromatic (meth)acrylate, but for an aromatic polymer, pi-pi interactions improve intermolecular stacking, and thus the overall modulus may increase. According to an embodiment, the second adhesive layer AP2 exhibiting low modulus properties may be disposed on the first adhesive layer AP1 to increase the overall flexibility of the adhesive layer AP, and thus the display device DD of an embodiment may have excellent bending reliability. For example, in case the adhesive layer AP includes the second adhesive layer AP2 disposed on the first adhesive layer AP1, compared to the case the adhesive layer AP includes the first adhesive layer AP1 alone, the adhesive layer AP may have sufficient flexibility, and thus the display device DD may have increased folding reliability and light output efficiency.

In an embodiment, the second base resin may include a polymer resin having a refractive index of about 1.45 to about 1.48. The second base resin included in the second adhesive layer AP2 may be used without limitation as long as the above refractive index is satisfied. For example, the second base resin may include an acrylic resin, a urethane-based resin, a fluorine-based resin, an epoxy-based resin, a polyester-based resin, a polyamide-based resin, a silicone-based resin, or a combination thereof. For example, the second base resin may include an acrylic resin.

Specifically, the second base resin may include aliphatic (meth)acrylate. The second adhesive layer AP2 may include a polymer resin formed from an aliphatic (meth)acrylate monomer or oligomer. In case the second base resin includes the aliphatic (meth)acrylate, and thus entanglement between polymer chains constituting the second base resin may increase to lower the modulus value of the second adhesive layer AP2, thereby enhancing flexibility of the display device DD. In case an external force is applied due to external shocks, the second adhesive layer AP2 may disperse and alleviate stress caused by repulsive action against the external shocks and may reduce the stress applied to the display panel DP. For example, the second adhesive layer AP2 may be highly absorbent of external shocks, and thus may prevent stress due to external shocks to a display panel.

The second adhesive layer AP2 may be an adhesive layer having a storage modulus of about 0.05 MPa to about 0.15 MPa at −20° C. The second adhesive layer AP2 may have a storage modulus of about 0.02 MPa to about 0.05 MPa at room temperature (25° C.), and a storage modulus of about 0.01 MPa to about 0.05 MPa at 60° C. For example, the second adhesive layer AP2 may have a storage modulus of about 0.08 MPa to about 0.12 MPa at −20° C., a storage modulus of about 0.025 MPa to about 0.05 MPa at room temperature (25° C.), and a storage modulus of about 0.02 MPa to about 0.035 MPa at 60° C.

In an embodiment, in case the second adhesive layer AP2 has a storage modulus of less than about 0.05 MPa at −20° C., the second adhesive layer AP2 may not exhibit sufficient adhesive strength. In case the second adhesive layer AP2 has a storage modulus of greater than 0.15 MPa at −20° C., the bending or folding stress of the display device DD may not be absorbed, and thus the adhesive layer AP may crack.

In case the storage modulus of the second adhesive layer AP2 satisfies the above range at each temperature, there is an advantage in that the second adhesive layer AP2 may be highly flexible, and the display device DD may have a maximized durability for folding. As there is no significant difference in the range of the storage modulus of the second adhesive layer AP2 at room temperature (25° C.) or higher, products may be less deformed, and thus the display device DD may have excellent reliability. In case the storage modulus of the second adhesive layer AP2 is out of the above range at each temperature, the temperature-dependent deformation of the second adhesive layer AP2 may increase, and thus the display device DD may have reduced durability and reliability.

The second adhesive layer AP2 may have a glass transition temperature of about −30° C. or less. For example, the second adhesive layer AP2 may have a glass transition temperature of about −35° C. or less. In case the glass transition temperature of the second adhesive layer AP2 satisfies the above range, excellent flexibility and processability may be achieved, and durability of the display device DD may be enhanced.

The second adhesive layer AP2 may have a creep value of about 10% or greater and less than about 50% at 60° C. In case the creep value of the second adhesive layer AP2 at 60° C. satisfies the above range, deformation of the second adhesive layer AP2 due to stress or pressure may be reduced. In case the creep value of the second adhesive layer AP2 at 60° C. is less than about 10%, deformation may not be sufficient in a folding mode, and in case the creep value of the second adhesive layer AP2 at 60° C. is 50% or greater, restoring force may become insufficient.

Referring to FIG. 8, the thicknesses of the first adhesive layer AP1 and the second adhesive layer AP2 may be different from each other. A thickness h2 of the second adhesive layer AP2 may be greater than a thickness h1 of the first adhesive layer AP1. However, the embodiment is not limited thereto, and the thicknesses of the first adhesive layer AP1 and the second adhesive layer AP2 may be the same. The thickness h1 of the first adhesive layer AP1 may be greater than a thickness h3 of the organic layer OL.

In case the thickness h2 of the second adhesive layer AP2 is greater than the thickness h1 of the first adhesive layer AP1, recovery rate from deformation of the adhesive layer AP may be excellent. The second adhesive layer AP2 may be formed on the first adhesive layer AP1, and accordingly, greater deformation may occur in the second adhesive layer AP2 in case the display device DD is folded or bent, and external impact applied to the second adhesive layer AP2 may be greater than that of the first adhesive layer AP1. In case the second adhesive layer AP2 is formed thicker than the first adhesive layer AP1, the adhesive layer AP may have increased overall recovery rate.

In an embodiment, the thickness h1 of the first adhesive layer AP1 may be about 3 μm or greater and less than about 25 μm. In case the thickness h1 of the first adhesive layer AP1 is less than about 3 μm, a step formed by the organic layer OL may not be covered, and in case the thickness h1 of the first adhesive layer AP1 is about 25 μm or greater, the display device DD may have deteriorated folding or bending characteristics due to the thick first adhesive layer AP1. In case the thickness h1 of the first adhesive layer AP1 satisfies the range described above, the first adhesive layer AP1 does not create a step around the organic layer OL and flattens an upper surface to ensure sufficient optical properties as well as preventing defects in the display device DD.

In an embodiment, the thickness h2 of the second adhesive layer AP2 may be about 25 μm to about 75 μm. In case the thickness h2 of the second adhesive layer AP2 is less than about 25 μm, the second adhesive layer AP2 may not have sufficient impact resistance properties, and in case the thickness h2 of the second adhesive layer AP2 is greater than about 75 μm, the display device DD may have deteriorated folding or bending characteristics due to the thick second adhesive layer AP2.

As a means of increasing light efficiency of a typical display device, a method of disposing a low refractive layer having a predetermined pattern on a display panel and forming a high refractive flat layer thereon to convert an exit angle of light emitted from the display panel has been used. However, this method requires an additional process for forming a high refractive flat layer, and defects such as cracks may be more likely to be caused due to high modulus properties of the high refractive flat layer, thereby making it hard to apply to a flexible display device.

The display device DD according to an embodiment may exhibit high flexibility as well as improved optical properties in case an adhesive layer AP of two layers having different optical and mechanical properties is applied, and thus, the display device DD having both high light extraction efficiency and bending reliability may be obtained. More specifically, in the display device DD of an embodiment, the organic layer OL in which openings corresponding to the light emitting regions PXA-R, PXA-B, and PXA-G are defined may be disposed on the display panel DP, and an adhesive layer AP may be disposed on the organic layer OL. The adhesive layer AP may include the first adhesive layer AP1 including a first base resin, and the second adhesive layer AP2 disposed on the first adhesive layer AP1 and including a second base resin. The first adhesive layer AP1 may have higher refractive properties than the organic layer OL, and thus may contribute to increasing light extraction efficiency, and the second adhesive layer AP2 may have a low modulus value, and thus may serve to provide high flexibility. Accordingly, when the adhesive layer AP of an embodiment is applied to the display device DD, the display device DD may have improved optical properties and bending reliability. As the adhesive layer AP having a light extraction function is applied to the organic layer OL, a typical additional process for high refractive flat layer may not be required, which may be beneficial in terms of productivity of the display device DD.

The adhesive layer AP included in the display device DD of an embodiment may be formed in a way that a resin composition for preparing the first adhesive layer AP1 and the second adhesive layer AP2 is sequentially applied to a base film and then cured through a separate process. Thereafter, the adhesive layer AP may be provided to the display device DD by attaching one surface of the adhesive layer AP cured in the form of an adhesive film to one surface of the display panel DP. Alternatively, the adhesive layer AP may be provided to the display device DD by attaching one surface of the first adhesive layer AP1 cured in the form of an adhesive film to one surface of the display panel DP, and attaching one surface of the second adhesive layer AP2 cured in the form of an adhesive film to the other surface of the first adhesive layer AP1. The method of attaching the prepared adhesive layer AP to the display panel DP may be performed according to a known method and is not limited to a specific method, and for example, a lamination process may be used.

The adhesive layer AP may also be formed by UV curing after being provided on one surface of the display panel DP in a state of a liquid resin composition. For example, the first adhesive layer AP1 may be applied and cured on the display panel DP in the state of a liquid resin composition, and then, the second adhesive layer AP2 may be applied and cured on the first adhesive layer AP1 in the state of a liquid resin composition to finally form the adhesive layer AP.

Hereinafter, a method for manufacturing a display device of an embodiment will be described with reference to FIGS. 9 and 10A to 10D. In the description of the method for manufacturing a display device of an embodiment, the description of the display device of an embodiment above may be applied. Hereinafter, in the description of the method for manufacturing a display device of an embodiment, duplicated descriptions as those described for the display device of an embodiment above will not be described again, and different features will be mainly discussed.

A method for manufacturing a display device of an embodiment may be the method for manufacturing the display device DD of an embodiment described with reference to FIGS. 1A to 8. An embodiment provides a method for manufacturing a display device including an adhesive layer AP disposed on a display panel DP of a display device DD.

Figure 9:
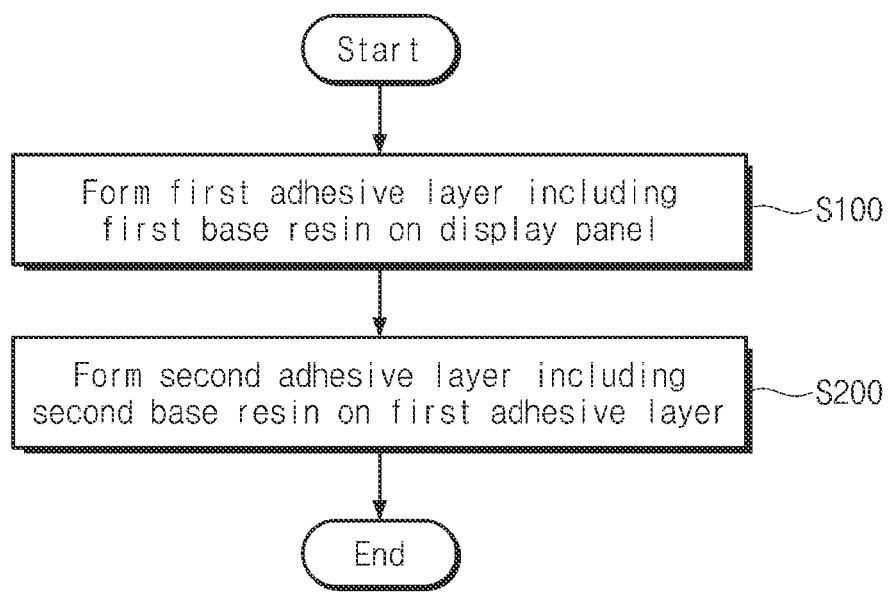
FIG. 9 is a flowchart showing a method for manufacturing a display device of an embodiment.

FIG. 9 is a flowchart illustrating a method for manufacturing a display device of an embodiment.

Referring to FIG. 9, the method for manufacturing a display device of an embodiment may include forming a first adhesive layer including a first base resin on a display panel (S100), and forming a second adhesive layer including a second base resin on the first adhesive layer (S200).

Figure 10A:
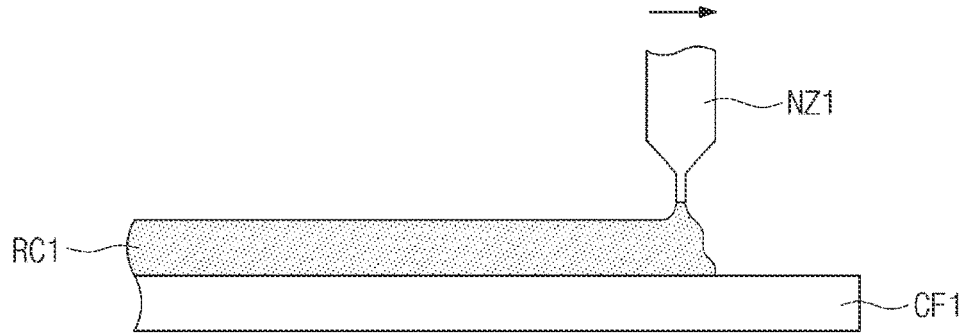
FIGS. 10A to 10F are schematic views showing processes in a method for manufacturing a display device of an embodiment.
Figure 10B:
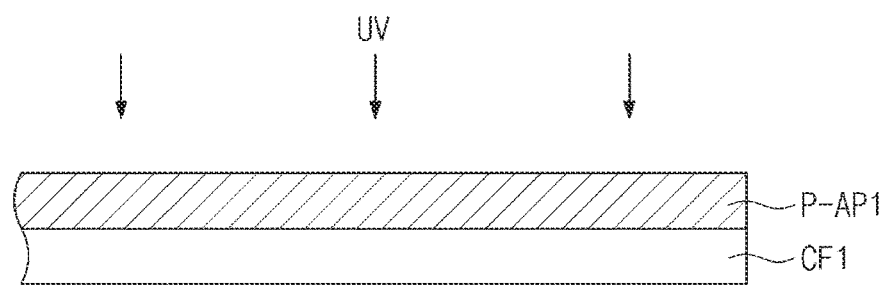
Figure 10C:
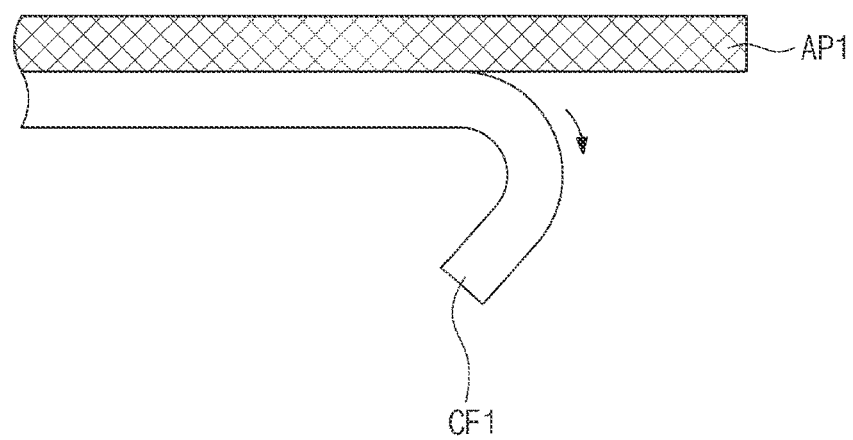
Figure 10D:
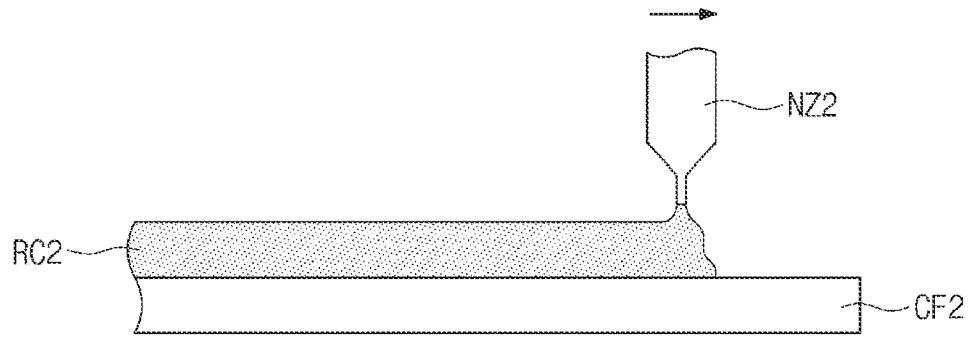
Figure 10E:
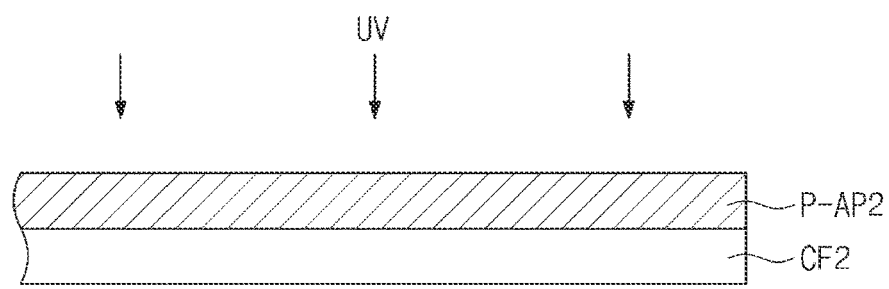
Figure 10F:
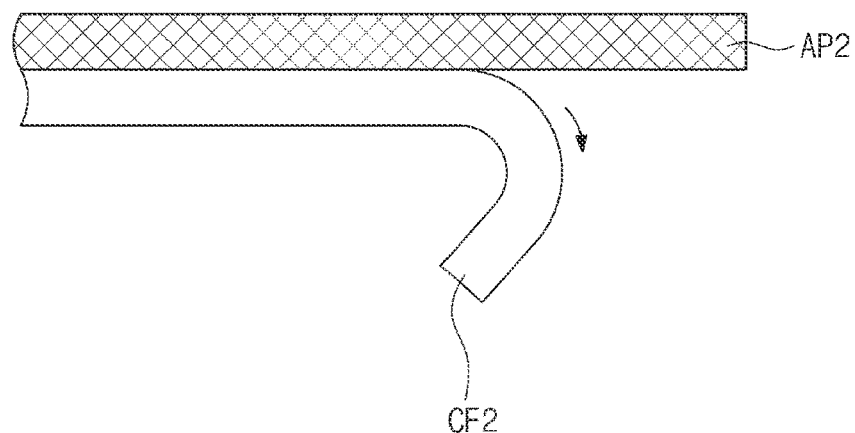

FIGS. 10A to 10F are schematic views illustrating processes of preparing the adhesive layer AP according to an embodiment. FIG. 10A illustrates a process of providing a first base resin RC1 for forming a first adhesive layer AP1, FIG. 10B illustrates a process of applying UV light to a preliminary first adhesive layer P-AP1, FIG. 10C illustrates a process of removing a first carrier film CF1, FIG. 10D illustrates a process of providing a second base resin RC2 for forming a second adhesive layer AP2, FIG. 10E illustrates a process of applying UV light to a preliminary second adhesive layer P-AP2, and FIG. 10F illustrates a process of removing a second carrier film CF2.

Referring to FIGS. 10A to 10C, the first base resin RC1 for forming the first adhesive layer AP1 may be provided on the first carrier film CF1. For example, a polyethylene terephthalate (PET) film may be used as the first carrier film CF1, but the embodiment is not limited thereto. The first carrier film CF1 may serve as a substrate for applying the liquid first base resin RC1, and may be used without limitation as long as it is easily detached from the first adhesive layer AP1 after UV curing. For example, the first carrier film CF1 may have one surface treated with release treatment.

The first base resin RC1 may include aromatic (meth) acrylate. In an embodiment, the first base resin RC1 may be one in which aromatic (meth)acrylate is provided in the form of a monomer or an oligomer. The first base resin RC1 may be in the form of a liquid before being cured.

The first base resin RC1 may include at least one photo-initiator. In one embodiment, the photo-initiator may be a photo-initiator activated by light in the ultraviolet region. The photo-initiator may be a photo-initiator activated by UV light having a central wavelength in a wavelength range of about 100 nm to about 400 nm. In case the first base resin RC1 includes a plurality of photo-initiators, different photo-initiators may be activated by UV light of different central wavelength ranges. In the description, the central wavelength indicates a wavelength representing a maximum intensity value of a light emission peak in the light emission spectrum of light source.

The photo-initiator may be any one selected from a group of 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, and 2-hydroxy-1-{4-[4-(2-hydroxy-2-methyl-propionyl)-benzyl]-phenyl}-2-methylpropan-1-one.

The photo-initiator may be any one selected from a group of 2-methyl-1[4-(methylthio)phenyl]-2-morpholinopropan-1-one, 2-benzyl-2-dimethylamino-1-(4-morpholinophenyl)-butanone-1,2-dimethylamino-2-(4-methyl-benzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl)heptylideneamino]benzoate, [1-[9-ethyl-6-(2-methylbenzoyl)carbazol-3-yl]ethylideneamino] acetate), and bis(2,4-cyclopentadienyl)bis[2,6-difluoro-3-(1-pyrryl)phenyl] titanium(IV). However, the embodiment is not limited thereto.

The first base resin RC1 may include at least an additive as needed. The additive may be appropriately selected from general additives known in the art in order to control the physical properties required for a resin composition. For example, the additive may be a light stabilizer, a crosslinking agent, an antioxidant, a chain transfer agent, a photo-sensitizer, a polymerization inhibitor, a leveling agent, a surfactant, an adhesion imparting agent, a plasticizer, a UV absorbent, a storage stabilizer, an antistatic agent, an inorganic filler, a pigment, a dye, and the like, but is not limited to thereto. The additive may be used alone or in combination of two or more.

The first base resin RC1 may be provided in various ways. For example, the first base resin RC1 may be provided through an inkjet printing method or a dispensing method. The first base resin RC1 may be provided through a first supply nozzle NZ1 and may be provided to keep a constant coating thickness. UV light may be applied to the preliminary first adhesive layer P-AP1 provided by being coated with the first base resin RC1 with a predetermined thickness. After the UV curing, the first carrier film CF1 used during the process may be removed to form the first adhesive layer AP1. The final first adhesive layer AP1 provided to the display device DD may have a storage modulus value of about 0.2 MPa to about 10 MPa at −20° C., and a storage modulus value of about 0.02 MPa to about 0.1 MPa at room temperature (25° C.), and a storage modulus value of about 0.01 MPa to about 0.05 MPa at 60° C.

FIG. 10B illustrates that the coated preliminary first adhesive layer P-AP1 may be directly irradiated with UV, but the embodiment is not limited thereto. A first auxiliary carrier film (not shown) may be also disposed on the preliminary first adhesive layer P-AP1, and the first auxiliary carrier film (not shown) may transmit UV light and may cover the preliminary first adhesive layer P-AP1 during the UV curing process.

Referring to FIGS. 10D and 10F, the second base resin RC2 for forming the second adhesive layer AP2 may be provided on the second carrier film CF2. The second base resin RC2 may include aliphatic (meth)acrylate. The second base resin RC2 may be one in which aliphatic (meth)acrylate is provided in the form of a monomer or an oligomer. The second base resin RC2 may be in the form of a liquid before being cured.

The second base resin RC2 may include at least one photo-initiator. The second base resin RC2 may also include at least an additive as needed. With respect to a photo-initiator and an additive included in the second base resin RC2, the same descriptions as those described for the first base resin RC1 above may be applied.

The second base resin RC2 may be provided in various ways. For example, the second base resin RC2 may be provided through an inkjet printing method or a dispensing method. The second base resin RC2 may be provided through a second supply nozzle NZ2 and may be provided to keep a constant coating thickness. UV light may be applied to the preliminary second adhesive layer P-AP2 provided by being coated with the second base resin RC2 with a predetermined thickness. After the UV curing, the second carrier film CF2 used during the process may be removed to form the second adhesive layer AP2. The final second adhesive layer AP2 (FIG. 7) provided to the display device DD may have a storage modulus value of about 0.05 MPa to about 0.15 MPa at −20° C., and a storage modulus value of about 0.02 MPa to about 0.05 MPa at room temperature (25° C.), and a storage modulus value of about 0.01 MPa to about 0.05 MPa at 60° C.

FIG. 10E illustrates that the coated preliminary second adhesive layer P-AP2 may be directly irradiated with UV, but the embodiment is not limited thereto. A second auxiliary carrier film (not shown) may be also disposed on the preliminary second adhesive layer P-AP2, and the second auxiliary carrier film (not shown) may transmit UV light and may cover the preliminary second adhesive layer P-AP2 during the UV curing process.

The first adhesive layer AP1 and the second adhesive layer AP2 prepared in the processes of FIGS. 10A to 10F may be applied to the display device DD. One surface of the first adhesive layer AP1 may be attached to the display panel DP. The first adhesive layer AP1 may be attached to entirely cover the organic layer OL (FIG. 7) disposed on the display panel DP. Thereafter, the second adhesive layer AP2 may be attached to the other surface of the first adhesive layer AP1 attached to the display panel DP.

FIGS. 10A to 10F illustrate, as a method of forming the adhesive layer AP, that the first adhesive layer AP1 and the second adhesive layer AP2 may be formed through a separate process and sequentially attached to the display panel DP, but the embodiment is not limited thereto. For example, the first adhesive layer AP1 and the second adhesive layer AP2 may be continuously formed on one carrier film to form the adhesive layer AP, and then one surface of the formed adhesive layer AP may be attached onto the display panel DP. Alternatively, the first adhesive layer AP1 and the second adhesive layer AP2 may be formed through a separate process and then be attached to each other to form the adhesive layer AP, and thereafter one surface of the adhesive layer AP may be attached onto the display panel DP.

The first base resin RC1 and the second base resin RC2 as a liquid may be sequentially applied onto the display panel DP and then cured to form the adhesive layer AP. FIGS. 11A to 11D illustrate a method for manufacturing a display device DD including an adhesive layer AP prepared through a method different from the method for preparing the adhesive layer AP described with reference to FIGS. 10A to 10F.

FIGS. 11A to 11D schematically illustrate a process of forming a first adhesive layer including a first base resin on a display panel (S100).

Figure 11A:
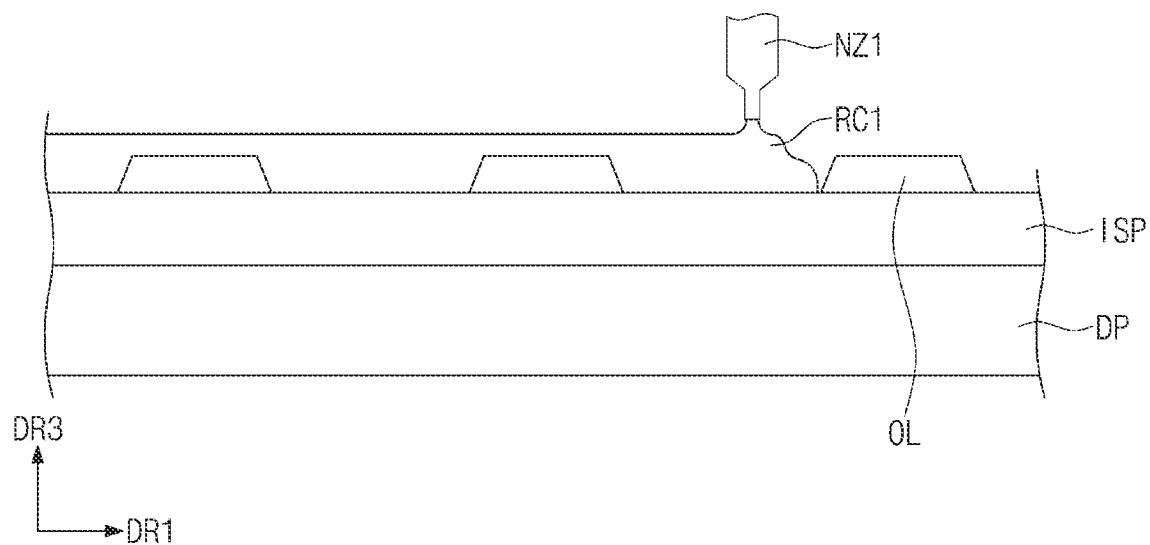
FIGS. 11A to 11D are schematic views showing processes in a method for manufacturing a display device of an embodiment.
Figure 11B:
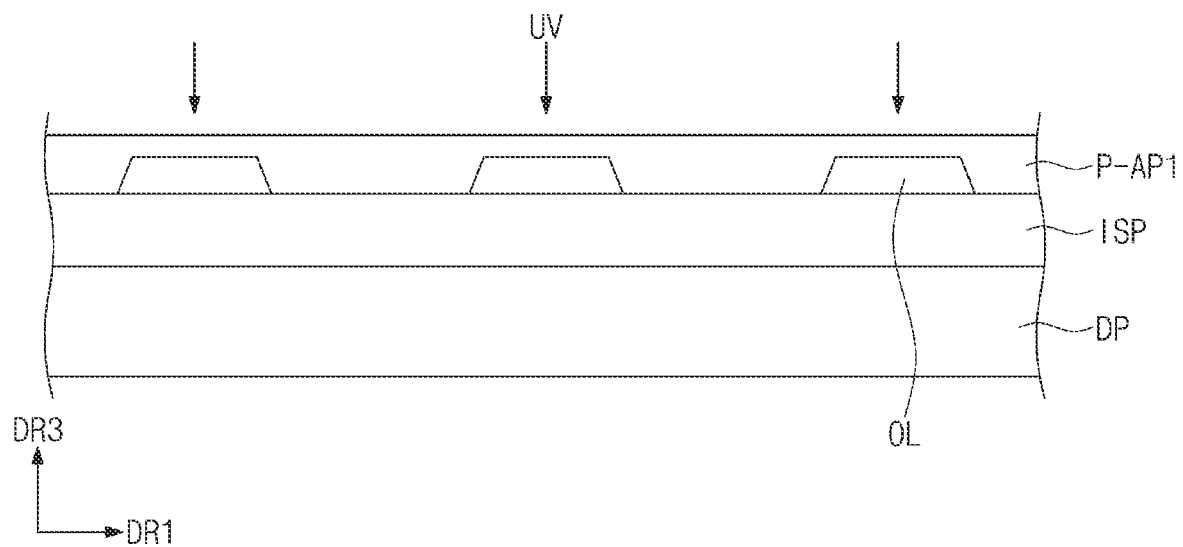
Figure 11C:
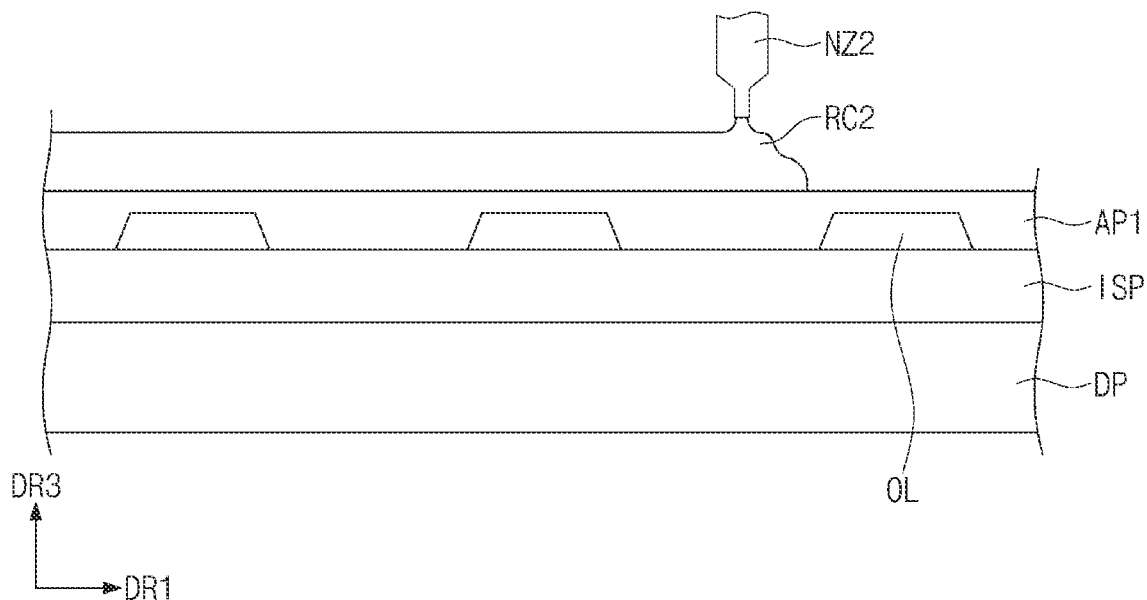
Figure 11D:
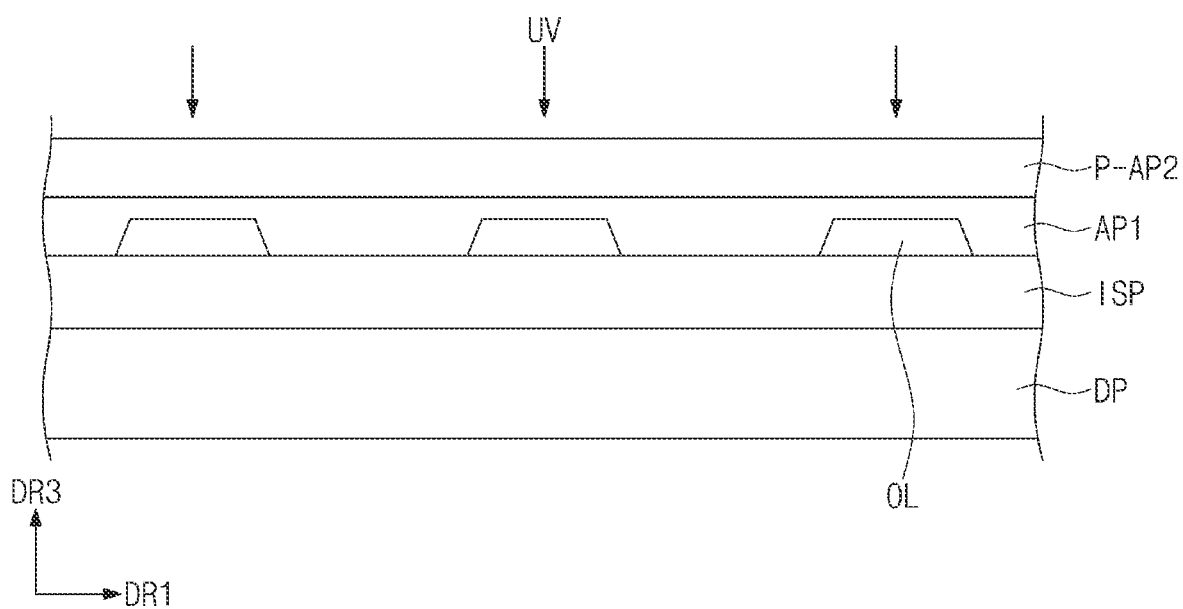

FIG. 11A illustrates a process of providing the first base resin RC1 for forming the first adhesive layer AP1, FIG. 11B illustrates a process of applying UV light to the preliminary first adhesive layer P-AP1 formed from the first base resin RC1, FIG. 11C illustrates a process of providing the second base resin RC2 for forming the second adhesive layer AP2, and FIG. 11D illustrates a process of applying UV light to the preliminary second adhesive layer P-AP2 formed from the second base resin RC2.

Referring to FIG. 11A, the first base resin RC1 may be provided on the display panel DP through the first supply nozzle NZ1. More specifically, the first base resin RC1 may be provided on the organic layer OL disposed on the display panel DP. For example, the first base resin RC1 may be provided after the input sensing member ISP is disposed on the display panel DP and the organic layer OL is disposed on the input sensing member ISP. The first base resin RC1 may be provided to fill an opening defined in the organic layer OL. The first base resin RC1 may be provided to entirely cover the organic layer OL. However, the embodiment is not limited thereto, and the first base resin RC1 may be disposed not to cover the entire organic layer OL, but to cover only a side surface of the organic layer OL. The first adhesive layer AP1 may substantially have the same thickness as an upper surface of the organic layer OL. In the description, "substantially the same" indicates not only that the numerical values of thickness, length, width, and the like of each component are completely the same, but also that those are identical within a range including differences that may occur due to process errors despite the same design.

Referring to FIGS. 11B and 11C, UV light for curing the first base resin RC1 may be provided on the preliminary first adhesive layer P-AP1 provided by being coated with the first base resin RC1 with a predetermined thickness. The preliminary first adhesive layer P-AP1 may be cured after polymerization through the provided UV light to form the first adhesive layer AP1.

The amount of UV light applied to the preliminary first adhesive layer P-AP1 may be the one sufficient to completely cure the first base resin RC1. However, unlike what is described above, the first base resin RC1 may be partially subjected to a polymerization reaction in a state of the preliminary first adhesive layer P-AP1, and then the second base resin RC2 for forming the second adhesive layer AP2 (FIG. 7) may be applied, and thereafter the first base resin RC1 and the second base resin RC2 may be subjected to an additional reaction to form a final adhesive layer AP.

Referring to FIG. 11C, the second base resin RC2 may be provided on the first adhesive layer AP1 through the second supply nozzle NZ2. The second base resin RC2 may be provided after the first adhesive layer AP1 is disposed on the organic layer OL.

Referring to FIG. 11D, UV light for curing the second base resin RC2 may be provided on the preliminary second adhesive layer P-AP2 provided by being coated with the second base resin RC2 with a predetermined thickness. The preliminary second adhesive layer P-AP2 may be cured after polymerization through the provided UV light to form the second adhesive layer AP2 (FIG. 7).

In the method for manufacturing a display device of an embodiment, an adhesive layer including a first adhesive layer and a second adhesive layer having different optical and mechanical properties may be included on a display panel to increase light efficiency of a display device as well preventing an increase in the overall modulus of the adhesive layer, thereby providing a display device having improved bending reliability and optical properties.

A display device of an embodiment may include an adhesive layer having high bending reliability and optical properties, and thus, may exhibit excellent durability and optical properties.

A method for manufacturing a display device of an embodiment may apply an adhesive layer having high bending reliability and optical properties, and thus, may provide a display device with excellent light output efficiency in various operating modes, as well as excellent durability and stability.

Although the disclosure has been described with reference to an embodiment, it will be understood that the disclosure should not be limited to the embodiments but various changes and modifications can be made by those skilled in the art without departing from the spirit and scope of the disclosure.

Hence, the technical scope of the disclosure is not limited to the detailed descriptions in the specification, but it should be determined only by reference of the claims.

What is claimed is:

1. A display device comprising:
   a display panel including:
      a light emitting region; and
      a peripheral region adjacent to the light emitting region;
   an organic layer disposed on the display panel and having an opening that overlaps the light emitting region; and
   an adhesive layer disposed on the organic layer, wherein the adhesive layer includes:
      a first adhesive layer including a first base resin and having a first refractive index; and
      a second adhesive layer disposed on the first adhesive layer, the second adhesive layer including a second base resin and having a second refractive index less than the first refractive index,
   the opening is defined by removing portions of the organic layer,
   the first base resin comprises an aromatic (meth)acrylate compound,
   the second base resin comprises an aliphatic (meth)acrylate compound,
   the organic layer has a third refractive index, and
   the first refractive index is greater than the third refractive index.

2. The display device of claim 1, wherein the aromatic (meth)acrylate compound is represented by any one of Formula 1, Formula 2, and Formula 3:

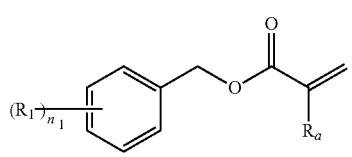
[Formula 1]

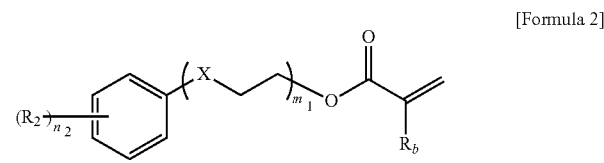
[Formula 2]

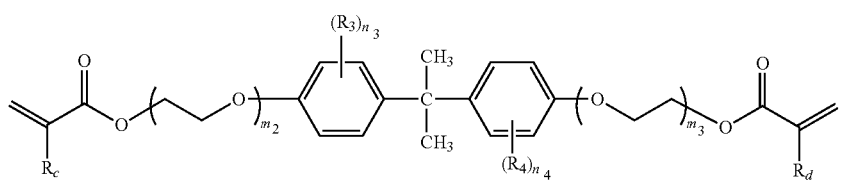
[Formula 3]

wherein in Formulas 1 to 3,

X is O or S, $R_a$, $R_b$, $R_c$, and $R_d$ are each independently a hydrogen atom, or a substituted or unsubstituted methyl group, $R_1$, $R_2$, $R_3$, and $R_4$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $n_1$ and $n_2$ are each independently an integer from 0 to 5, $n_3$ and $n_4$ are each independently an integer from 0 to 4, and $m_1$, $m_2$, and $m_3$ are each independently an integer from 0 to 6.

3. The display device of claim 1, wherein the first adhesive layer further comprises a filler dispersed in the first base resin.

4. The display device of claim 3, wherein the filler comprises at least one of zirconium oxide and titanium oxide.

5. The display device of claim 3, wherein the filler comprises polystyrene beads.

6. The display device of claim 1, wherein
   the first refractive index is in a range of about 1.55 to about 1.7, and
   the second refractive index is in a range of about 1.45 to about 1.48.

7. The display device of claim 1, wherein the first adhesive layer has a thickness in a range of about 3 μm to about 25 μm.

8. The display device of claim 1, wherein the second adhesive layer has a thickness in a range of about 25 μm to about 75 μm.

9. The display device of claim 1, wherein
   the first adhesive layer has a storage modulus in a range of about 0.2 MPa to about 10 MPa at −20° C., and
   the second adhesive layer has a storage modulus in a range of about 0.05 MPa to about 0.15 MPa at −20° C.

10. The display device of claim 1, wherein the first adhesive layer covers the organic layer.

11. The display device of claim 1, wherein the display panel comprises a first non-folding region, a folding region, and a second non-folding region which are arranged in a predetermined direction.

12. The display device of claim 1, further comprising an input sensing member disposed between the display panel and the adhesive layer.

13. The display device of claim 1, further comprising an anti-reflection member disposed on the adhesive layer.

14. A display device comprising:
   a folding region and a non-folding region which are adjacent to each other;
   a display panel including:
      a light emitting region; and a peripheral region adjacent to the light emitting region;
an organic layer disposed on the display panel and having an opening that overlaps the light emitting region; and
an adhesive layer disposed on the organic layer, wherein the adhesive layer includes:
- a first adhesive layer including a first base resin, the first base resin including an aromatic (meth)acrylate compound; and
- a second adhesive layer disposed on the first adhesive layer and including a second base resin, the opening is defined by removing portions of the organic layer, the second base resin comprises an aliphatic (meth)acrylate compound, and the first adhesive layer has a refractive index greater than a refractive index of the organic layer and a refractive index of the second adhesive layer.

15. The display device of claim 14, wherein the first adhesive layer further comprises a filler dispersed in the first base resin.

16. An electronic device comprising a display device, the display device comprising:
a display panel including:
a light emitting region; and
a peripheral region adjacent to the light emitting region;
an organic layer disposed on the display panel and having an opening that overlaps the light emitting region; and
an adhesive layer disposed on the organic layer, wherein the adhesive layer includes:
- a first adhesive layer including a first base resin and having a first refractive index; and
- a second adhesive layer disposed on the first adhesive layer, the second adhesive layer including a second base resin and having a second refractive index less than the first refractive index, the opening is defined by removing portions of the organic layer, the first base resin comprises an aromatic (meth) acrylate compound, the second base resin comprises an aliphatic (meth) acrylate compound, the organic layer has a third refractive index, and the first refractive index is greater than the third refractive index.

* * * * *